(12) United States Patent
Kim et al.

(10) Patent No.: US 10,818,647 B2
(45) Date of Patent: Oct. 27, 2020

(54) PIXEL STRUCTURE, DISPLAY APPARATUS INCLUDING THE PIXEL STRUCTURE, AND METHOD OF MANUFACTURING THE PIXEL STRUCTURE

(71) Applicant: SAMSUNG DISPLAY CO., LTD., Yongin-si, Gyeonggi-do (KR)

(72) Inventors: Daehyun Kim, Yongin-si (KR); Hyundeok Im, Yongin-si (KR); Hyunmin Cho, Yongin-si (KR); Jonghyuk Kang, Yongin-si (KR); Sungjin Hong, Yongin-si (KR); Jooyeol Lee, Yongin-si (KR); Chio Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/646,428

(22) Filed: Jul. 11, 2017

(65) Prior Publication Data

US 2018/0012876 A1    Jan. 11, 2018

(30) Foreign Application Priority Data

Jul. 11, 2016   (KR) .................. 10-2016-0087384

(51) Int. Cl.
*H01L 33/38*   (2010.01)
*H01L 25/16*   (2006.01)
(Continued)

(52) U.S. Cl.
CPC ........ *H01L 25/167* (2013.01); *H01L 25/0753* (2013.01); *H01L 27/124* (2013.01);
(Continued)

(58) Field of Classification Search
CPC . H01L 25/167; H01L 25/0753; H01L 27/124; H01L 33/325; H01L 33/42;
(Continued)

(56) References Cited

U.S. PATENT DOCUMENTS 6,018,167 A    1/2000  Oota
7,727,788 B2   6/2010  Han et al.
(Continued)

FOREIGN PATENT DOCUMENTS

CN    102468410 A    5/2012
CN    102569579 A    7/2012
(Continued)

OTHER PUBLICATIONS

Ju, Jiaqi, et al., "Modern Landscape Illumination Engineering Design," Time Publishing and Media Co., Ltd., Anhui Science and Technology Press, Feb. 2015, with an English translation of the relevant part, 8 pages.
(Continued)

*Primary Examiner* — Allen L Parker
*Assistant Examiner* — Gustavo G Ramallo
(74) *Attorney, Agent, or Firm* — Lewis Roca Rothgerber Christie LLP

(57) ABSTRACT

A pixel structure of a display apparatus includes an electrode line, at least one ultra small light-emitting diode, and a connection electrode. The electrode line includes a second electrode separated from a first electrode and at a same level as the first electrode on a base substrate. The at least one ultra small light-emitting diode is on the base substrate and has a length less than a distance between the first and second electrodes. A connection electrode includes a first contact electrode connecting the first electrode to the ultra small
(Continued)

light-emitting diode and a second contact electrode connecting the second electrode to the ultra small light-emitting diode.

13 Claims, 19 Drawing Sheets

(51) Int. Cl.
| | |
|---|---|
| *H01L 25/075* | (2006.01) |
| *H01L 27/12* | (2006.01) |
| *H01L 33/32* | (2010.01) |
| *H01L 33/42* | (2010.01) |
| *H01L 21/68* | (2006.01) |
| *H01L 33/06* | (2010.01) |
| *H01L 33/60* | (2010.01) |
| *H01L 33/62* | (2010.01) |

(52) U.S. Cl.
CPC .......... *H01L 33/325* (2013.01); *H01L 33/385* (2013.01); *H01L 33/387* (2013.01); *H01L 33/42* (2013.01); *H01L 21/68* (2013.01); *H01L 33/06* (2013.01); *H01L 33/60* (2013.01); *H01L 33/62* (2013.01); *H01L 2224/95085* (2013.01); *H01L 2933/0066* (2013.01)

(58) Field of Classification Search
CPC ....... H01L 33/60; H01L 33/62; H01L 33/387; H01L 33/385
See application file for complete search history.

(56) References Cited

U.S. PATENT DOCUMENTS

| | | | |
|---|---|---|---|
| 8,754,913 B2 | 6/2014 | Hwang et al. | |
| 8,759,124 B2 | 6/2014 | Miyoshi et al. | |
| 8,872,214 B2 | 10/2014 | Negishi et al. | |
| 8,945,959 B2 | 2/2015 | Chen et al. | |
| 9,063,607 B2 | 6/2015 | Liu | |
| 9,219,197 B1 | 12/2015 | Chen et al. | |
| 9,287,242 B2 | 3/2016 | Shibata et al. | |
| 9,329,433 B2 | 5/2016 | Negishi et al. | |
| 9,735,199 B2 | 8/2017 | Choi et al. | |
| 9,905,612 B2 | 2/2018 | Kwon et al. | |
| 2005/0285127 A1* | 12/2005 | Noto | H01L 33/42 257/96 |
| 2006/0027827 A1* | 2/2006 | Tain | H01L 33/486 257/99 |
| 2011/0254043 A1 | 10/2011 | Negishi et al. | |
| 2012/0138982 A1 | 6/2012 | Chen et al. | |
| 2012/0273963 A1 | 11/2012 | Mirsky et al. | |
| 2013/0027623 A1* | 1/2013 | Negishi | H01L 25/0753 349/42 |
| 2013/0087823 A1* | 4/2013 | Tsai | H01L 33/38 257/98 |
| 2014/0145237 A1 | 5/2014 | Do et al. | |
| 2015/0359056 A1 | 12/2015 | Song et al. | |
| 2016/0111689 A1 | 4/2016 | Han | |
| 2016/0148911 A1 | 5/2016 | Do | |
| 2016/0211245 A1 | 7/2016 | Do | |
| 2017/0229482 A1* | 8/2017 | Chen | H01L 27/124 |
| 2017/0358563 A1 | 12/2017 | Cho et al. | |
| 2018/0019369 A1* | 1/2018 | Cho | H01L 27/156 |
| 2018/0287010 A1 | 10/2018 | Sung | |
| 2019/0013298 A1* | 1/2019 | Lai | H01L 25/0753 |
| 2019/0115513 A1* | 4/2019 | Im | H01L 33/387 |
| 2019/0172970 A1* | 6/2019 | Dupont | H01L 27/1446 |

FOREIGN PATENT DOCUMENTS

| | | |
|---|---|---|
| CN | 102782892 A | 11/2012 |
| CN | 103531670 A | 1/2014 |
| CN | 103545462 A | 1/2014 |
| CN | 103855180 A | 6/2014 |
| CN | 105321985 A | 2/2016 |
| CN | 105405943 A | 3/2016 |
| DE | 10 2011 057 173 A1 | 7/2012 |
| JP | 2011-103435 A | 5/2011 |
| JP | 2011-205060 A | 10/2011 |
| JP | 2011-205106 A | 10/2011 |
| KR | 10-0296202 B1 | 10/2001 |
| KR | 10-2007-0096212 A | 10/2007 |
| KR | 10-2011-0043461 A | 4/2011 |
| KR | 10-1244926 B1 | 3/2013 |
| KR | 10-1307556 | 9/2013 |
| KR | 10-2014-0097603 A | 8/2014 |
| KR | 10-1436123 B1 | 11/2014 |
| KR | 10-2015-0006798 A | 1/2015 |
| KR | 10-1518286 B1 | 5/2015 |
| KR | 10-2017-0141305 | 12/2017 |
| WO | 2016/080710 A1 | 5/2016 |

OTHER PUBLICATIONS

KOMP PhD, Richard J., "Practical Photovoltaic Technology," China Optoelectronic Technology Development Center, Aviation Industry Press, 1988, with an English translation of the relevant part, 6 pages.
Xu, Dongmei, "A New Method for Fabrication Microelectrode and Its Application in the Field of Sensor," Chinese chemical Society, Aug. 2014, 1 page.
Chuanchuan, Li, et al., "Flip-Chip AlGaInP LEDs with Current-Guiding Structure," Acta Optica Sinica, vol. 32, No. 7, Jul. 2012, 4 pages.
Chinese Office Action dated Sep. 3, 2020, for corresponding Chinese Patent Application No. 201710560211.4 (10 pages).

* cited by examiner

PIXEL STRUCTURE, DISPLAY APPARATUS INCLUDING THE PIXEL STRUCTURE, AND METHOD OF MANUFACTURING THE PIXEL STRUCTURE

CROSS-REFERENCE TO RELATED APPLICATION

Korean Patent Application No. 10-2016-0087384, filed on Jul. 11, 2016, and entitled: "Pixel Structure, Display Apparatus Including the Pixel Structure, and Method of Manufacturing the Pixel Structure," is incorporated by reference herein in its entirety.

BACKGROUND

1. Field

One or more embodiments described herein relate to a pixel structure, a display apparatus including a pixel structures, and a method for manufacturing a pixel structure.

2. Description of the Related Art

A light-emitting diode (LED) has high optical conversion efficiency, very low power consumption, a semi-permanent lifetime, and is eco-friendly device. Accordingly, LEDs are used for traffic lights, mobile phones, headlights of vehicles, outdoor electronic displays, back light units, indoor illuminations, and other applications.

When used in a display, an LED is connected to an electrode to receive supply power. In establishing this connection, attempts have been made to arrange and reduce the space occupied by the electrode. One attempt involves directly growing an LED on the electrode. Another attempt involves placing an LED on the electrode after being independently and separately grown. In the latter case, if the LED a general light-emitting element, a three dimensional (3D) light-emitting element may be connected to an electrode by placing the 3D light-emitting element in an upright position. However, this connection may be difficult when the LED is an ultra small light-emitting element having a nano size or a micro size.

SUMMARY

One or more embodiments include pixel structures configured to prevent damage to an ultra small light-emitting diode in a process of aligning the ultra small light-emitting diode and to increase efficiency of light emitted towards a front face of the ultra small light-emitting diode, display apparatuses including the pixel structures, and methods of manufacturing the pixel structures.

One or more embodiments include pixel structures configured to prevent an ultra small light-emitting diode from deviating to a certain region in a process of aligning the ultra small light-emitting diode and to increase efficiency of light emitted towards a front face of the ultra small light-emitting diode, display apparatuses including the pixel structures, and methods of manufacturing the pixel structures.

Additional aspects will be set forth in part in the description which follows and, in part, will be apparent from the description, or may be learned by practice of the presented embodiments.

In accordance with one or more embodiments, a pixel structure of a display apparatus includes an electrode line including a second electrode separated from a first electrode and at a same level as the first electrode on a base substrate; at least one ultra small light-emitting diode on the base substrate and having a length less than a distance between the first and second electrodes; and a connection electrode including a first contact electrode connecting the first electrode to the ultra small light-emitting diode and a second contact electrode connecting the second electrode to the ultra small light-emitting diode.

The first and second contact electrodes may be transparent electrodes. A surface of at least one of the first or second electrodes facing the ultra small light-emitting diode may be a reflection surface that reflects light to be emitted from the ultra small light-emitting diode. Each of the first and second electrodes may have a thickness greater than a thickness of the ultra small light-emitting diode. An angle of the reflection surface relative to the base substrate may be less than 90 degrees.

The ultra small light-emitting diode may includes first and second electrode layers respective ends of the ultra small light-emitting diode; first and second semiconductor layers between the first and second electrode layers; and a first active layer between the first and second semiconductor layers, wherein the first and second electrode layers are transparent electrodes. Each of the first and second electrodes may include a main electrode extending in a first direction and a finger electrode extending from the main electrode in a second direction crossing the first direction.

A surface of the finger electrode facing the ultra small light-emitting diode may be a reflection surface to reflect light. The finger electrode may be electrically connected to the ultra small light-emitting diode via at least one of the first or second contact electrodes. The pixel structure may include a dam structure on an outer side of the first and second electrodes, and the dam structure may have a thickness greater than thicknesses of each of the first and second electrodes. The pixel structure may include a driving transistor electrically connected to the first electrode; and a power line electrically connected to the second electrode.

In accordance with one or more other embodiments, a pixel structure of a display apparatus includes a guide structure on a base substrate and having a central region and a plurality of guide regions extending in radial form from the central region; a plurality of ultra small light-emitting diodes in the guide regions; and a dam structure that blocks an end of the guide regions. A length of each of the ultra small light-emitting diodes may be less than a width of the guide regions.

The guide structure may include first and second electrodes that extend in radial form and are separated from each other to define the guide regions. Each of the first and second electrodes may have a thickness greater than the thickness of the ultra small light-emitting diodes. A distance between the first and second electrodes may be greater than a length of the ultra small light-emitting diodes, and the pixel structure may include first and second contact electrodes connecting the ultra small light-emitting diodes to the first and second electrodes.

The guide structure may include a plurality of guide bars that extend in a radial form, are separated from each other to define the guide regions, and have a thickness greater than the thickness of the ultra small light-emitting diodes. A distance between the guide bars may be greater than the length of each of the ultra small light-emitting diodes. The pixel structure may include a driving transistor electrically connected to the first electrode and a power line electrically connected to the second electrode.

In accordance with one or more other embodiments, a display apparatus includes a pixel structure previously described and a driver connected to the pixel structure.

In accordance with one or more other embodiments, a display apparatus includes a pixel structure previously described and a driver connected to the pixel structure.

In accordance with one or more other embodiments, a method for manufacturing a pixel structure includes forming first and second electrodes on a base substrate, the first and second electrodes spaced from each other by a predetermined distance; forming a dam structure on an outer side of the first and second electrodes; coating the base substrate with a solution including a plurality of ultra small light-emitting diodes having a length less than the distance between the first and second electrodes; aligning the ultra small light-emitting diodes by applying a predetermined voltage to the first and second electrodes; and electrically connecting the ultra small light-emitting diodes to the first and second electrodes.

In accordance with one or more other embodiments, a method for manufacturing a pixel structure including forming a guide structure including a central region and a plurality of guide regions extending in radial form from the central region on a base substrate; forming a dam structure that blocks an end of the guide regions; coating a central region of the base substrate with a solution including a plurality of ultra small light-emitting diodes; moving the solution comprising a plurality of the ultra small light-emitting diodes to the guide regions; and aligning the ultra small light-emitting diodes by applying a predetermined voltage to the first and second electrodes.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
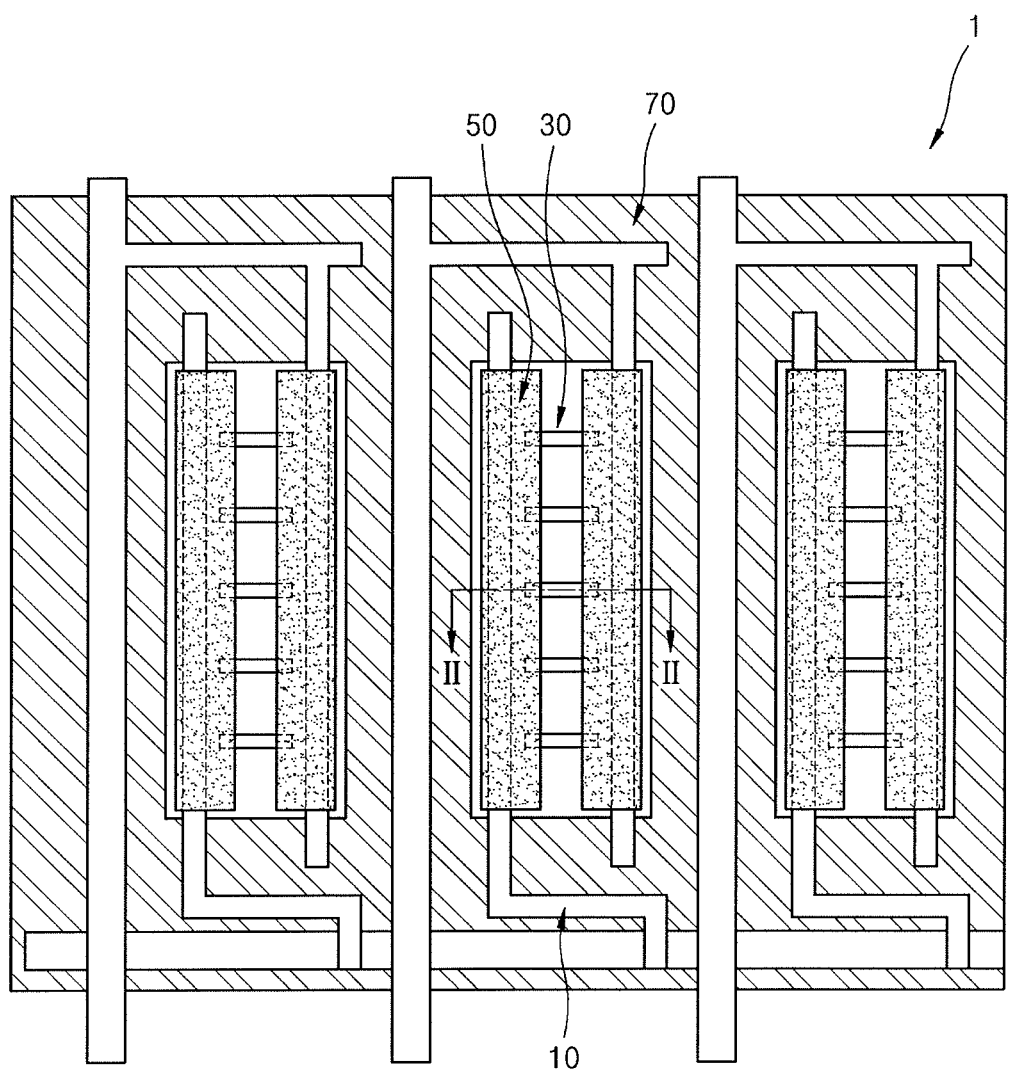
FIG. 1 illustrates an embodiment of a pixel structure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
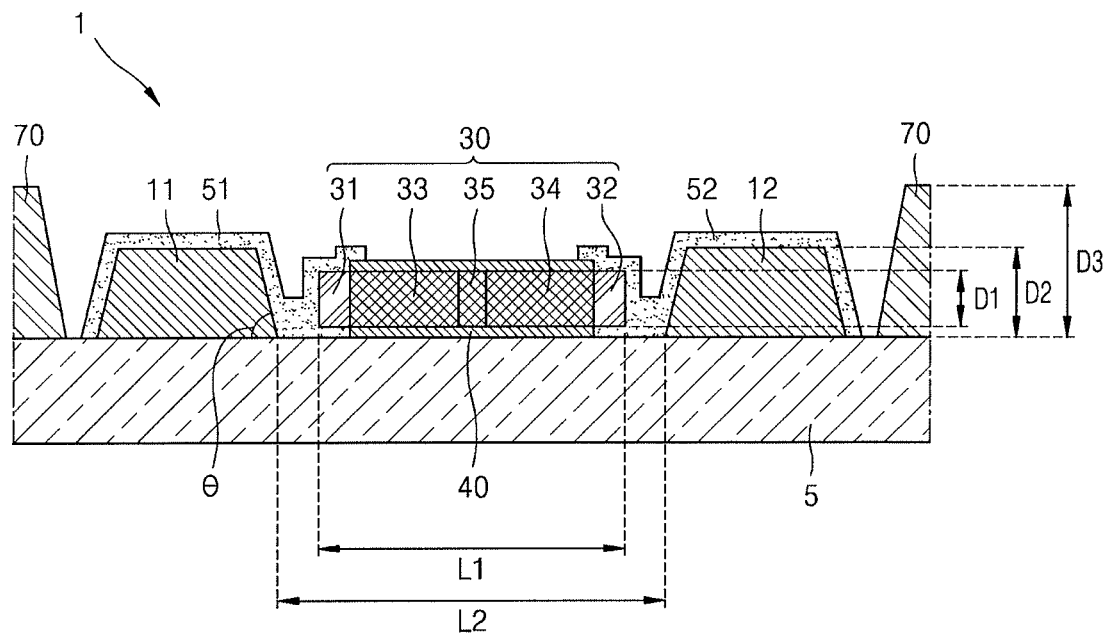
FIG. 2 illustrates a view along section line II-II in FIG. 1.

FIG. 1 illustrates an embodiment of a pixel structure 1 of a display apparatus, and FIG. 2 is a cross-sectional view along line II-II of the pixel structure 1 in FIG. 1.

Referring to FIG. 1, the pixel structure 1 may include a connection electrode 50 that connects an electrode line 10 to an ultra small light-emitting diode 30, and a dam structure 70 on an outer side the electrode line 10. The pixel structure 1 may also include a plurality of the electrode lines 10, a plurality of the ultra small light-emitting diodes 30, and a plurality of the connection electrodes 50. A plurality of pixel structures 1 may be arranged in a display region of a display apparatus 1000.

Referring to FIGS. 1 and 2, the electrode line 10 may include a second electrode 12 separated from a first electrode 11. The first electrode 11 and the second electrode 12 are at the same level on a base substrate 5. In FIGS. 1 and 2, the first electrode 11 and the second electrode 12 are depicted as being directly disposed on the base substrate 5 as an example. In one embodiment, a buffer layer, a thin film transistor, and/or other features may be between base substrate 5 and the first and second electrodes 11 and 12.

The base substrate 5 may be, for example, a glass substrate, a quartz substrate, a sapphire substrate, a plastic substrate, or a foldable and flexible polymer film.

The first electrode 11 and the second electrode 12 are spaced apart by a predetermined distance L. The first and second electrodes 11 and 12 may serve to align the ultra small light-emitting diode 30 in a manufacturing process of the pixel structure 1. The first and second electrodes 11 and 12 supply electrical signals to the ultra small light-emitting diode 30 in a completed pixel structure 1.

The ultra small light-emitting diode 30 is between the first and second electrodes 11 and 12. The ultra small light-emitting diode 30 has a length less than a gap L2 between the first and second electrodes 11 and 12. For example, the ultra small light-emitting diode 30 may have a length in a range from about 0.5 um to about 10 um. Since the length L1 of the ultra small light-emitting diode 30 is less than the distance L2 between the first and second electrodes 11 and 12, ends of the ultra small light-emitting diode 30 may not simultaneously contact the first and second electrodes 11 and 12.

As indicated, in the pixel structure 1, the ends of the ultra small light-emitting diode 30 do not contact the first and second electrodes 11 and 12, in order to align the ultra small light-emitting diode 30 in a manufacturing process of the pixel structure 1. Thus even when a high voltage is applied to the first and second electrodes 11 and 12, the high voltage may not be applied to the ultra small light-emitting diode 30. Therefore, damage to the ultra small light-emitting diode 30 or to the first and second electrodes 11 and 12, that otherwise may occur when a high voltage is applied to ends of the ultra small light-emitting diode 30, may be prevented.

The ultra small light-emitting diode 30 has a predetermined shape, e.g., a cylindrical shape or another shape. The ultra small light-emitting diode 30 includes first and second electrode layers 31 and 32 on edges thereof, first and second semiconductor layers 33 and 34 between the first and second electrode layers 31 and 32, and an active layer 35 between the first and second semiconductor layers 33 and 34. The first electrode layer 31, the first semiconductor layer 33, the active layer 35, the second semiconductor layer 34, and the second electrode layer 31 are sequentially stacked in a length direction of the ultra small light-emitting diode 30.

The first and second electrode layers 31 and 32 may be, for example, ohmic contact electrodes or Schottky contact electrodes. The first and second electrode layers 31 and 32 may include a conductive metal. For example, the first and second electrode layers 31 and 32 may include, for example, at least one of Al, Ti, In, Au, or Ag. The first and second electrode layers 31 and 32 may include the same or different materials.

The first semiconductor layer 33 may be, for example, an n-type semiconductor layer. According to an embodiment, if the ultra small light-emitting diode 30 is a blue color light-emitting diode, the first semiconductor layer 33 may include a semiconductor material having a composition of $In_xAl_yGa_{1-x-y}N$ ($0 \leq x \leq 1$, $0 \leq y \leq 1$, $0 \leq x+y \leq 1$), for example, at least one of InAlGaN, GaN, AlGaN, InGaN, AlN, and InN, and may be doped with a first dopant (for example, Si, Ge, and Sn). The ultra small light-emitting diode 30 may be a different color diode having another kind III-V group semiconductor material as the n-type semiconductor layer.

The second semiconductor layer 34 may be, for example, a p-type semiconductor layer. As an example, if the ultra small light-emitting diode 30 is a blue color light-emitting diode, the second semiconductor layer 34 may include a semiconductor material having a composition of $In_xAl_yGa_{1-x-y}N$ ($0 \leq x \leq 1$, $0 \leq y \leq 1$, $0 \leq x+y \leq 1$), for example, at least one of InAlGaN, GaN, AlGaN, InGaN, AlN, and InN, and may be doped with a second dopant (for example, Mg). The ultra small light-emitting diode 30 may be a different color light-emitting diode having a semiconductor material corresponding to the p-type semiconductor layer.

The active layer 35 is between the first and second semiconductor layers 33 and 34 and may be formed to have a single or multiple quantum well structure. As an example, a clad layer doped with a conductive dopant may be on upper and/or a lower side of the active layer 35. The clad layer doped with a conductive dopant may be, for example, an AlGaN layer or an InAlGaN layer. In one embodiment, a material (e.g., AlGaN or AlInGaN) may be used as the active layer 35. Light is emitted based on a combination of electron and hole pairs in the active layer 35, and the location of the active layer 35 may differ according to the type of the light-emitting device. The ultra small light-emitting diode 30 may be different from a blue color light-emitting device having a different kind of group III-V semiconductor material in the active layer 35.

An insulating layer 40 may be around the ultra small light-emitting diode 30. The insulating layer 40 may cover side surfaces of the active layer 35. The insulating layer 40 may protect side surface of the ultra small light-emitting diode 30 as well as the side surface of the active layer 35.

The connection electrode 50 may include a first contact electrode 51, that connects the ultra small light-emitting diode 30 and the first electrode 11, and a second contact electrode 52 that connects the ultra small light-emitting diode 30 and the second electrode 12. The first contact electrode 51 connects the first electrode layer 31 of the ultra small light-emitting diode 30 and the first electrode 11 by contacting the first electrode layer 31 and the first electrode 11. The second contact electrode 52 connects the second electrode layer 32 of the ultra small light-emitting diode 30 and the second electrode 12 by contacting the first electrode layer 32 and the second electrode 12.

The first and second contact electrodes 51 and 52 may include a conductive metal. For example, the first and second contact electrode layer 51 and 52 may include at least one of Al, Ti, In, Au, or Ag.

The dam structure 70 may be on outer side of the first and second electrodes 11 and 12. The dam structure 70 may have a thickness greater than those of the first and second electrodes 11 and 12. The dam structure 70 may prevent a solution including a plurality of the ultra small light-emitting diodes 30 from inadvertently moving to other regions in a process of manufacturing the pixel structure 1. The dam structure 70 may include, for example, a material that is able to maintain a predetermined thickness. For example, the material of the dam structure 70 may be polyimide or another material. A surface of the dam structure 70 may have hydrophobicity.

Figure 3:
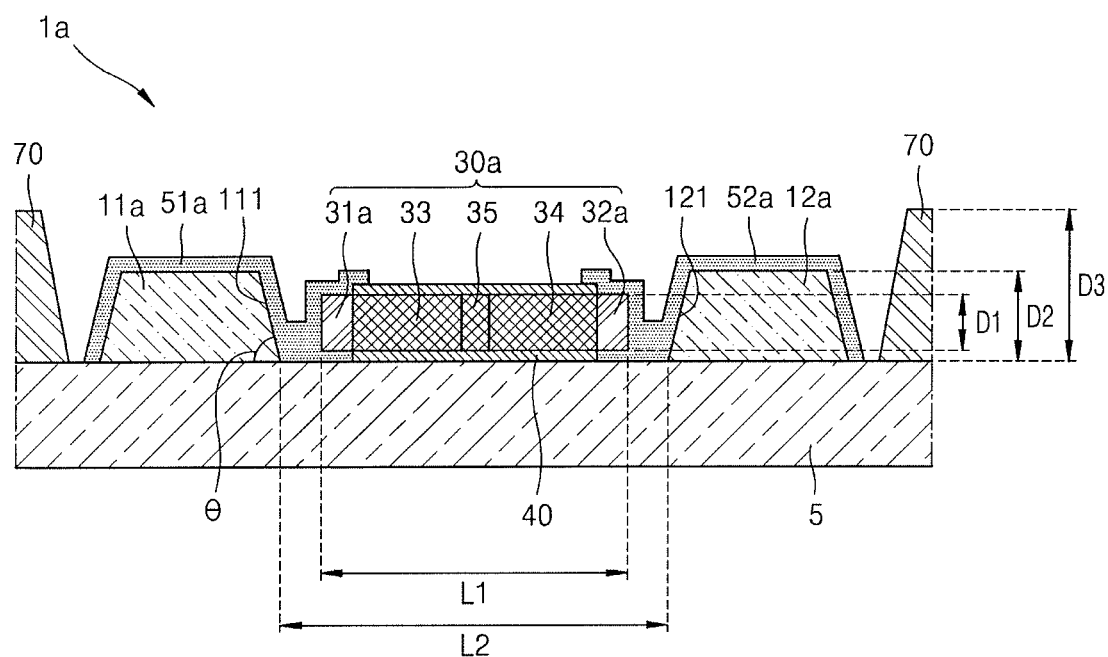
FIG. 3 illustrates another embodiment of a pixel structure.

FIG. 3 illustrates another embodiment of a pixel structure 1a in cross-section. Referring to FIG. 3, the pixel structure 1a includes a plurality of connection electrodes 50 that connect electrode lines 10 and ultra small light-emitting diodes 30. At least one of first and second electrodes 11a and 12a may have reflection surfaces 111 and 121 facing the ultra small light-emitting diode 30a. For example, the first and second electrodes 11a and 12a may respectively have the reflection surfaces 111 and 121 facing the ultra small light-emitting diode 30a. A material of the first and second electrodes 11a and 12a may be treated to have reflection characteristics, or surfaces of the first and second electrodes 11a and 12a may be treated to have reflection characteristics.

The reflection surfaces 111 and 121 of the first and second electrodes 11a and 12a may reflect light emitted from the ultra small light-emitting diode 30a towards an upper side of the pixel structure 1a. The first and second electrodes 11a and 12a may have a thickness D2 greater than the thickness D1 of the ultra small light-emitting diode 30a. Also, the reflection surfaces 111 and 121 of the first and second electrodes 11a and 12a may have an angle θ with respect to the base substrate 5 less than 90 degrees.

At least one of first and second electrode layers 31a and 32a of the ultra small light-emitting diode 30a may include a transparent electrode. For example, the first and second electrode layers 31a and 32a respectively may have a transparent electrode. For example, the first and second electrode layers 31a and 32a may respectively include at least one of ITO or IGO as a transparent electrode.

First and second contact electrode 51a and 52a, that respectively connect the first and second electrode layers 31a and 32a and the first and second electrodes 11a and 12a, may include a transparent electrode. For example, the first and second contact electrodes 51a and 52a may respectively include at least one of ITO or IGO as a transparent electrode.

Light may be emitted from at least an edge of the ultra small light-emitting diode 30a. Light emitted through the first electrode layer 31a or the second electrode layer 32a may proceed towards an upper side of the pixel structure 1a by being reflected at the reflection surfaces 111 and 121 of the first and second electrodes 11a and 12a. Accordingly, light emission efficiency of the pixel structure 1a may be increased.

The present embodiment includes a structure in which light is emitted through both ends of the ultra small light-emitting diode 30a. In one embodiment, the present embodiment may be applied to a structure in which light is emitted through only one end of the ultra small light-emitting diode 30a.

Figure 4:
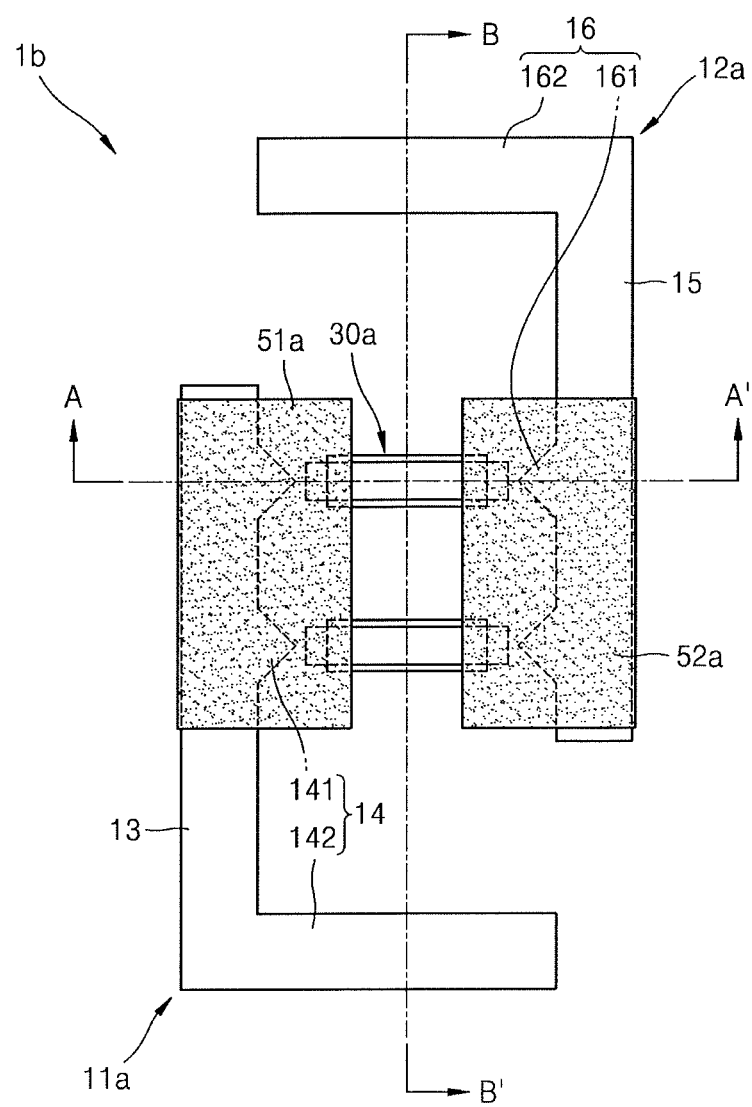
FIG. 4 illustrates another embodiment of a pixel structure.
Figure 5A:
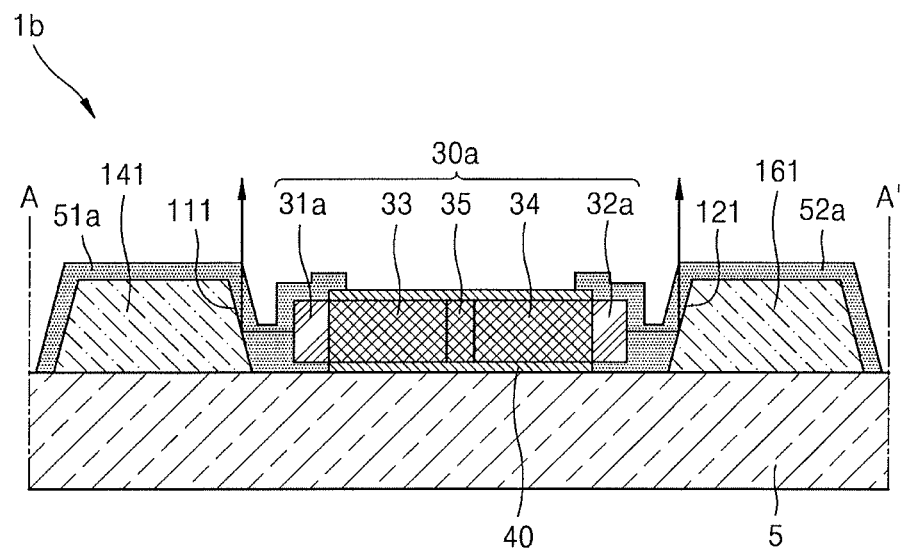
FIGS. 5A and 5B illustrate views along section lines A-A' and B-B' in FIG. 4.
Figure 5B:
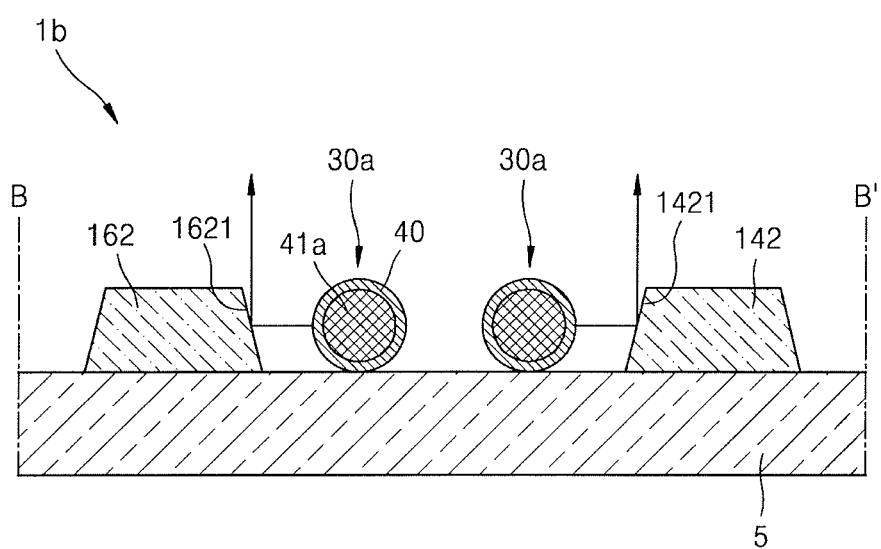

FIG. 4 illustrates another embodiment of a pixel structure 1b of a display apparatus. FIG. 5A is a cross-sectional view taken along line A-A' of FIG. 4, and FIG. 5B is a cross-sectional view taken along line B-B' of FIG. 4.

Referring to FIG. 4, the first electrode 11a of the pixel structure 1b may include a first finger electrode 14 extending from a first main electrode 13. The second electrode 12a may include a second finger electrode 16 extending from a second main electrode 15. The first and second main electrodes 13 and 15 may extend in a first direction. The first and second finger electrodes 14 and 16 may extend in a second direction crossing the first direction. As an example, the second direction may be perpendicular to the first direction.

The first finger electrode 14 may include a first sub-finger electrode 141 extending towards the ultra small light-emitting diode 30a and a second sub-finger electrode 142 extending parallel to the first sub-finger electrode 141. The second finger electrode 16 may include a third sub-finger electrode 161 extending towards the ultra small light-emitting diode 30a and a fourth sub-finger electrode 162 extending parallel to the third sub-finger electrode 161. The first sub-finger electrode 141 is connected to an edge of the ultra small light-emitting diode 30a via the first contact electrode 51a. The third sub-finger electrode 161 is connected to the other edge of the ultra small light-emitting diode 30a via the second contact electrode 52a.

The length of the first and third sub-finger electrodes 141 and 161 in the second direction may not be uniform along the first direction. For example, with respect to the length of the first and third sub-finger electrodes 141 and 161 in the second direction, the length of a central part may be greater than the length of outer parts. For example, a plane shape of the first and third sub-finger electrodes 141 and 161 may have a triangular shape. The location of the ultra small light-emitting diode 30a may be precisely arranged by the first and third sub-finger electrodes 141 and 161.

Referring to FIG. 5A, in the first and third sub-finger electrodes 141 and 161, surfaces facing the ultra small light-emitting diode 30a may be the reflection surfaces 111 and 121 that reflect light. The reflection surfaces 111 and 121 may form an angle with respect to the base substrate 5 of less than 90 degrees. Accordingly, light emitted from an edge of the ultra small light-emitting diode 30 may proceed towards an upper side of the pixel structure 1b by being reflected at the first and third sub-finger electrodes 141 and 161.

Referring to FIG. 5B, in the second and fourth sub-finger electrodes 142 and 162, surface facing the ultra small light-emitting diode 30a may be reflection surfaces 1421 and 1621 that reflect light. An angle of the reflection surfaces 1421 and 1621 with respect to the base substrate 5 may be less than 90 degrees. Accordingly, light emitted from sides, not both ends, of the ultra small light-emitting diode 30a may proceed towards an upper side of the pixel structure 1b by being reflected at the second and fourth sub-finger electrodes 142 and 162.

As described above, light emitted from both ends and the sides of the ultra small light-emitting diode 30a may be reflected at the reflection surfaces 111, 121, 1421, and 1621 of the first through fourth sub-finger electrodes 141, 142, 161, and 162. Thus, the emission efficiency of the pixel structure 1b may be increased.

Figure 6:
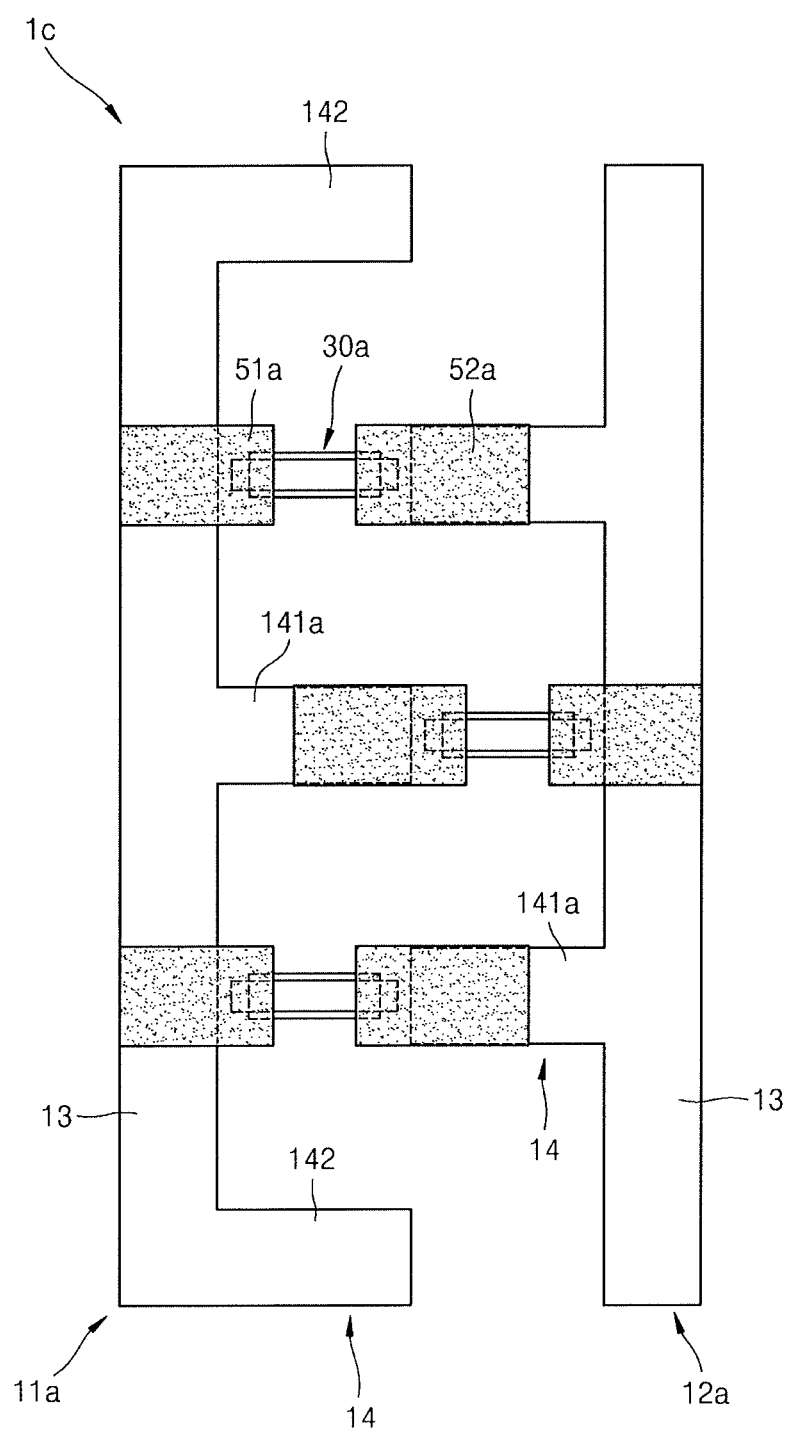
FIG. 6 illustrates another embodiment of a pixel structure.

The present embodiment corresponds to a structure of the first and second electrodes 11, 12, 11a, and 12a in which light emitted from the edges of the ultra small light-emitting diode 30 and 30a is reflected at the first and third sub-finger electrodes 141 and 161 and light emitted from the sides of the ultra small light-emitting diode 30 and 30a is reflected at the second and fourth sub-finger electrodes 142 and 162. In one embodiment, like the pixel structure 1c (e.g., refer to FIG. 6), first and third sub-finger electrodes 141a and 161a of the first and second electrodes 11, 12, 11a, and 12a may have reflection surfaces that reflect light emitted from the edges of the ultra small light-emitting diode 30a as well as light emitted from sides of another ultra small light-emitting diode 30a.

Figure 7:
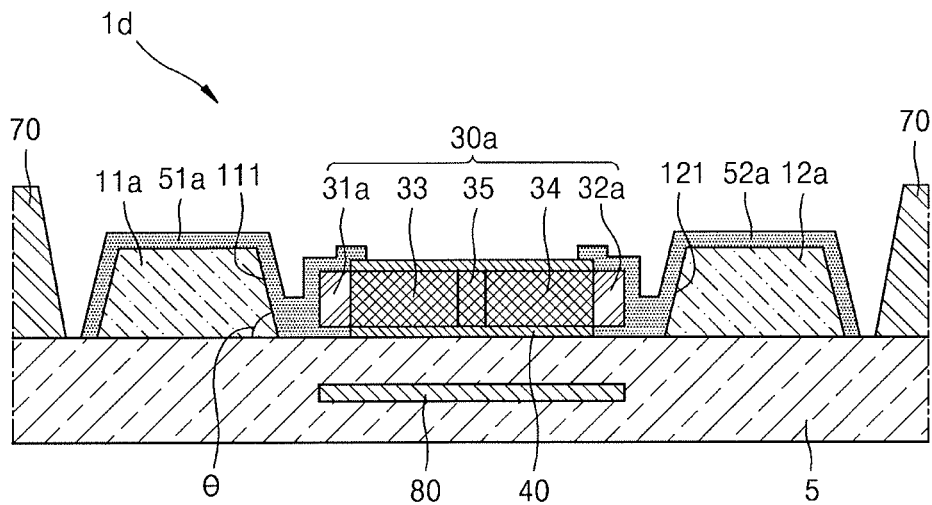
FIG. 7 illustrates another embodiment of a pixel structure.

Also, in order to increase emission efficiency of a pixel structure 1d in FIG. 7, the base substrate 5 of the pixel structure 1d may further include a reflection plate 80 within the pixel structure 1d. Accordingly, the reflection plate 80 may reduce loss of light emitted towards a lower side from a side of the ultra small light-emitting diode 30.

Figure 8A:
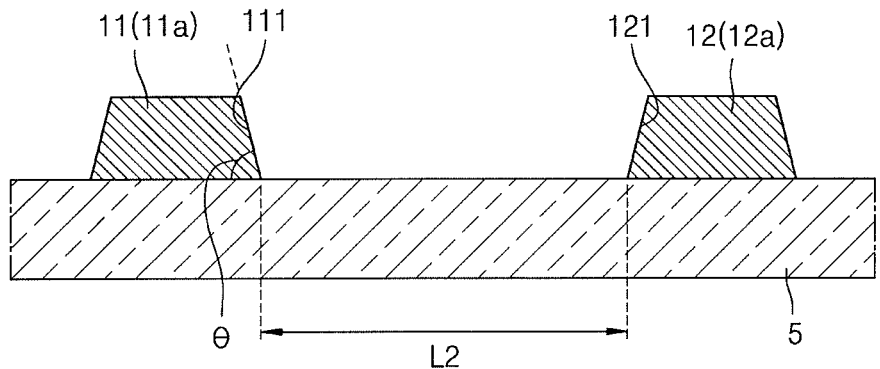
FIGS. 8A-8D illustrate an embodiment of a method for manufacturing a pixel structure.

FIGS. 8A to 8D are cross-sectional views corresponding to an embodiment of a method for manufacturing a pixel structure. Referring to FIG. 8A, first and second electrodes 11 and 12 (11a and 12a) may be formed on a base substrate 5. The first and second electrodes 11 and 12 (11a and 12a) may be spaced apart by a predetermined distance L2. Surfaces of the first and second electrodes 11 and 12 (11a and 12a) facing each other may the reflection surfaces 111 and 121 that reflect light. An angle θ of the reflection surfaces 111 and 121 relative to base substrate 5 may be less than 90 degrees.

Figure 8B:
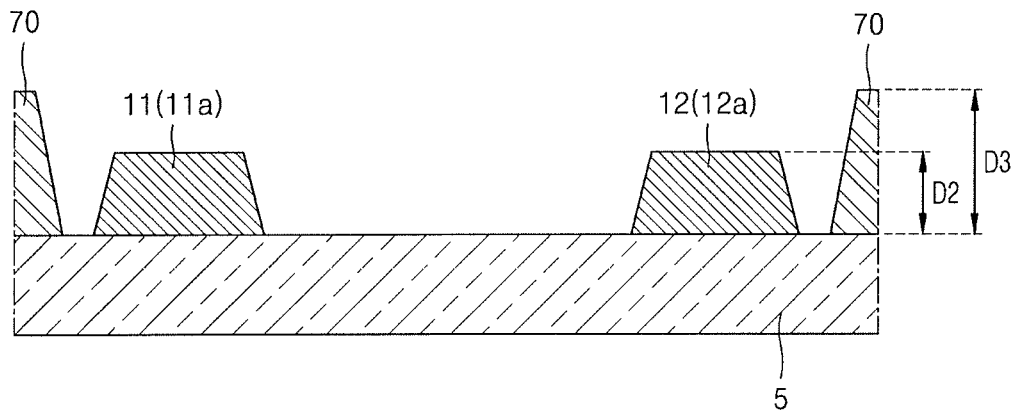

Referring to FIG. 8B, a dam structure 70 may be formed on outer sides of the first and second electrodes 11 and 12 (11a and 12a). The dam structure 70 may have a thickness D3 greater than the thickness D2 of the first and second electrodes 11 and 12 (11a and 12a). The dam structure 70 may include different material from that of the first and second electrodes 11 and 12 (11a and 12a). For example, the material for forming the dam structure 70 may be an organic material or an inorganic material that is able to maintain a predetermined structure. For example, the dam structure 70 may include polyimide.

Figure 8C:
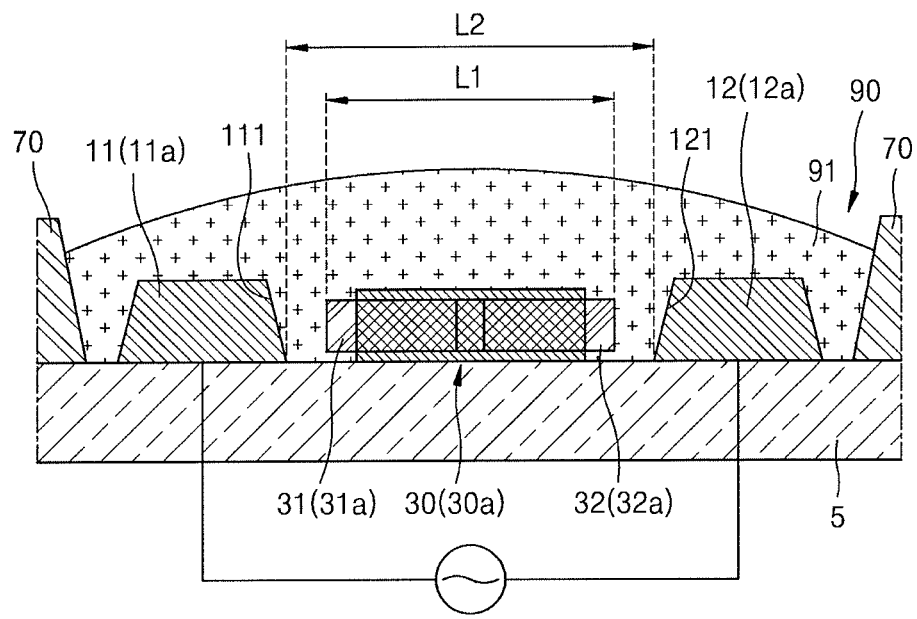

Referring to FIG. 8C, a solution 90 that includes a plurality of ultra small light-emitting diodes 30 (30a) may be coated on the base substrate 5. The dam structure 70 may prevent the coated solution 90 from over flowing. A solvent 91 of the solution 90 may include, for example, at least one of acetone, water, isopropyl alcohol, or toluene. The solvent 91 may be various materials having volatility. The ultra small light-emitting diode 30 (30a) may have a length L1 less than the distance L2 between the first and second electrodes 11 and 12 (11a and 12a).

A high voltage may be applied to the first and second electrodes 11 and 12 (11a and 12a) to form an electric field. The high voltage may be, for example, in a range from 20 V to 50 V. The ultra small light-emitting diode 30 (30a) may be between the first and second electrodes 11 and 12 (11a and 12a) by the electric field formed by the first and second electrodes 11 and 12 (11a and 12a). For example, the ultra small light-emitting diode 30 (30a) is arranged so that the ends of the ultra small light-emitting diode 30 (30a) face the first and second electrodes 11 and 12 (11a and 12a).

Since the length L1 of the ultra small light-emitting diode 30 (30a) is less than the distance L2 between the first and second electrodes 11 and 12 (11a and 12a), application of the high voltage to the ends of the ultra small light-emitting diode 30 (30a) may be prevented. Therefore, problems may be prevented, e.g., damage to the ultra small light-emitting diode 30 (30a) or to the first and second electrodes 11 and 12 (11a and 12a) resulting from high voltage applied to the both ends of the ultra small light-emitting diode 30 (30a).

Figure 8D:
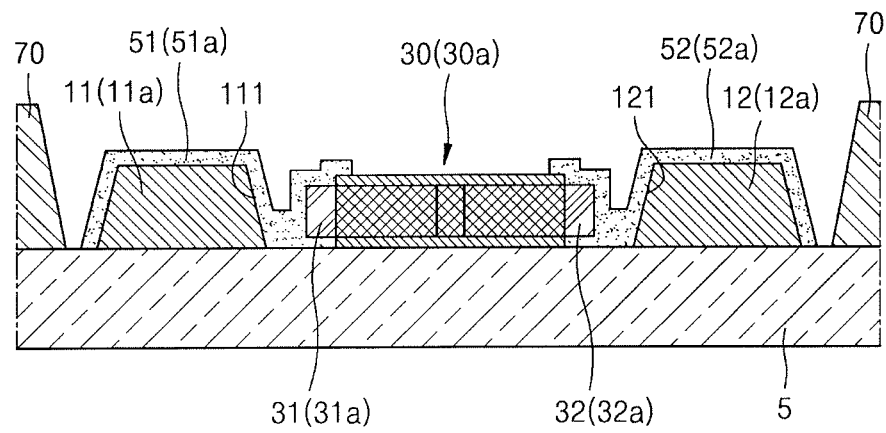

Referring to FIG. 8D, when both ends of the ultra small light-emitting diode 30 (30a) face the first and second electrodes 11 and 12 (11a and 12a) between the first and second electrodes 11 and 12 (11a and 12a), the solvent 91 of the solution is removed. As an example, the solvent 91 of the solution 90 may be removed by evaporation.

After the solvent 91 is removed, the first and second contact electrodes 51 and 52 (51a and 52a) are formed to contact the ultra small light-emitting diode 30 (30a) and the first and second electrodes 11 and 12 (11a and 12a). The first and second contact electrodes 51 and 52 (51a and 52a) may be transparent electrodes. Accordingly, light emitted from the edges of the ultra small light-emitting diode 30 (30a) may be reflected at the first and second electrodes 11 and 12 (11a and 12a).

Comparative Example 1

In Comparative Example 1, the distance between the first electrode 11 and the second electrode 12 is less than a length of the ultra small light-emitting diode 30. Thus, both ends of the ultra small light-emitting diode 30 are supported by the first and second electrodes 11 and 12. The first contact electrode 51 may be connected to the first electrode 11 and the ultra small light-emitting diode 30 and the second contact electrode 52 may be connected to the ultra small light-emitting diode 30 and the second electrode 12.

Embodiment 1

The pixel structure 1 according to Embodiment 1 is illustrated in FIG. 3. In Embodiment 1, the distance L2 between the first and second electrodes 11a and 12a is greater than the length L1 of the ultra small light-emitting diode 30a. Thus, both ends of the ultra small light-emitting diode 30a may not directly contact the first and second electrodes 11a and 12a. The first electrode 11a and the ultra small light-emitting diode 30a are connected by the transparent first contact electrode 51a, and the second electrode 12a and the ultra small light-emitting diode 30a are connected by the transparent second contact electrode 52a. The first and second electrode layers 31a and 32a of the ultra small light-emitting diode 30a are transparent electrodes.

In the first and second electrodes 11a and 12a, surface facing the ultra small light-emitting diode 30a are reflection surfaces 111 and 121. An angle of the reflection surfaces 111 and 121 with respect to the base substrate is less than 90 degrees.

Embodiment 2

The pixel structure 1d according to the Embodiment 2 is illustrated in FIG. 7. In Embodiment 2, the distance L2 between the first and second electrodes 11a and 12a is greater than the length L1 of the ultra small light-emitting diode 30a. Thus, the both ends of the ultra small light-emitting diode 30a may not directly contact the first and second electrodes 11a and 12a. The reflection plate 80 is formed in the base substrate 5.

An example of light extraction efficiencies of the Comparative example 1 and Embodiments 1 and 2 is set forth in Table 1.

TABLE 1

| Items | Comparative Example 1 | Embodiment 1 | Embodiment 2 |
|---|---|---|---|
| Emission efficiency | 7.4% | 18.5% | 24% |

Referring to Table 1, Comparative example 1, Embodiment 1, and Embodiment 2 respectively have light extraction efficiencies of 7.4%, 18.5%, and 24%. Thus, the emission efficiency of Embodiment 1 is 250% higher than Comparative Example 1, and the emission efficiency of Embodiment 2 is 324% higher than Comparative Example 1.

Figure 9:
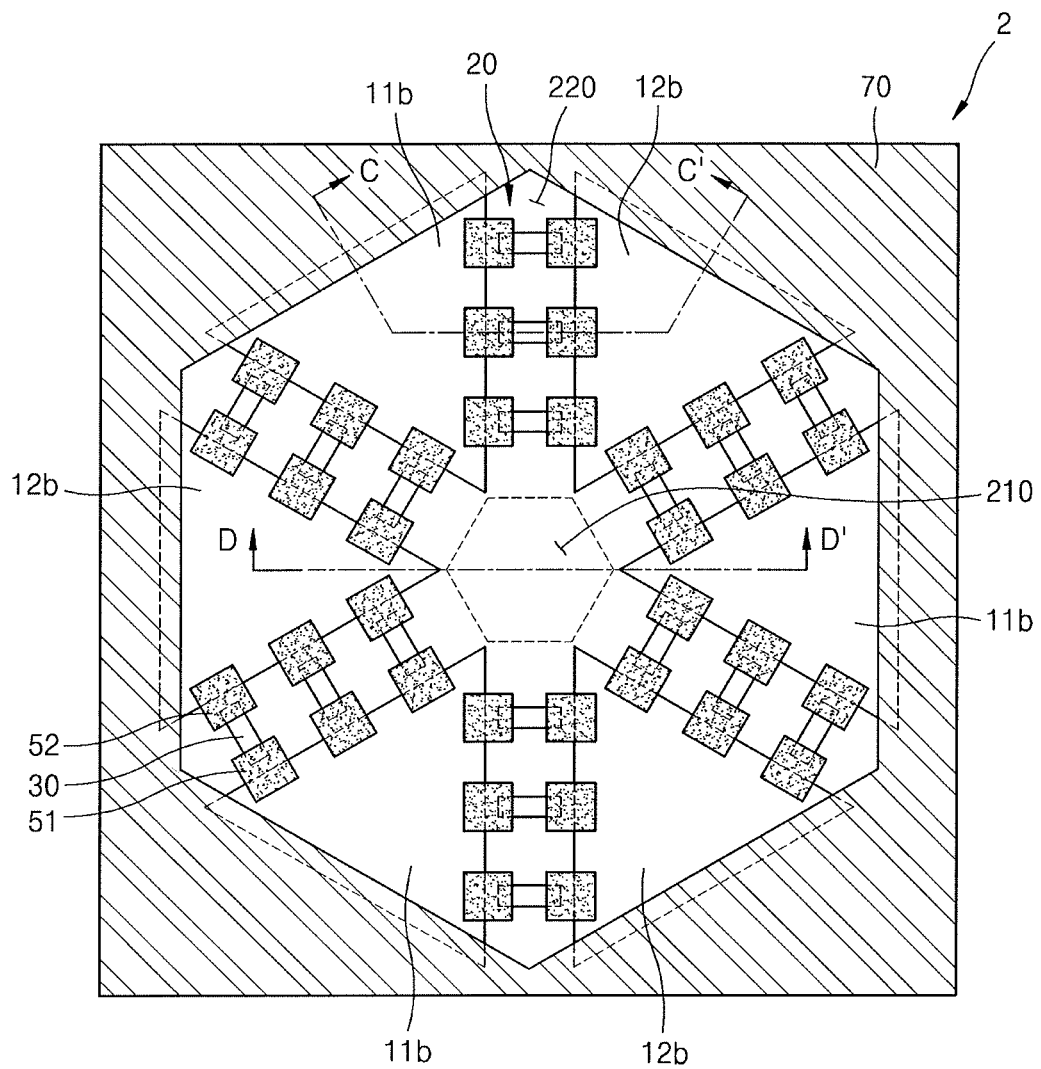
FIG. 9 illustrates another embodiment of a pixel structure.
Figure 10A:
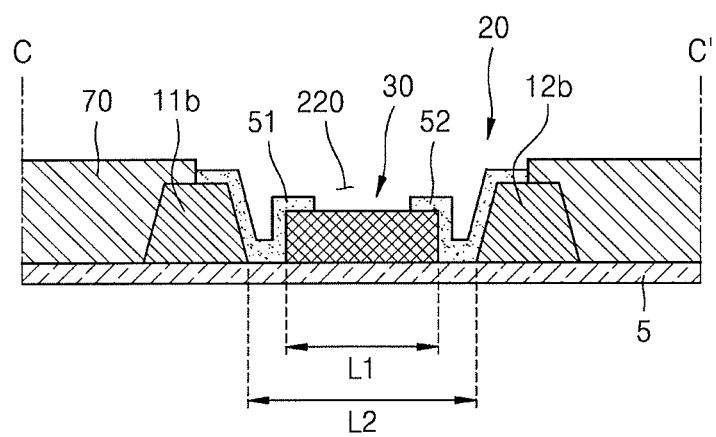
FIGS. 10A-10B illustrate views along section lines C-C" and D-D' in FIG. 9.
Figure 10B:
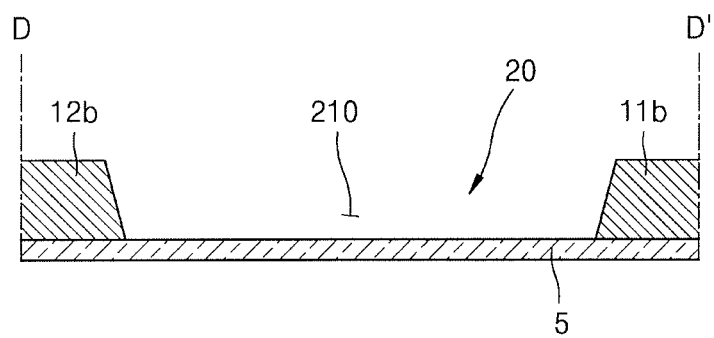
Figure 18:
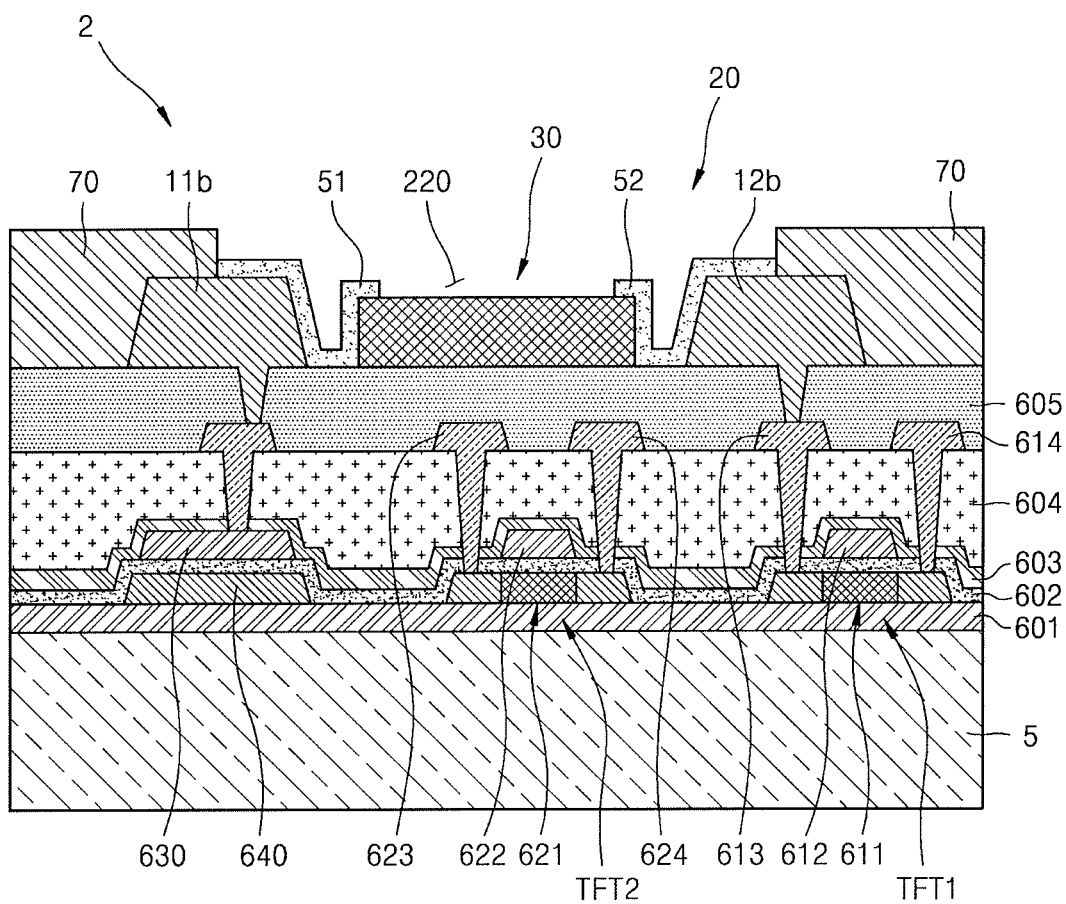

FIG. 9 illustrates another embodiment of a pixel structure 2 of a display apparatus according. FIG. 10A is a cross-sectional view taken along line C-C' in FIG. 9, and FIG. 5B is a cross-sectional view taken along line D-D' in FIG. 9. In FIGS. 10A and 10B, first and second electrodes 11b and 12b are directly disposed on a base substrate 5. However, as depicted in FIG. 18, other layers or configurations, for example, a buffer layer or a thin film transistor may be between the base substrate 5 and the first and second electrodes 11b and 12b.

Referring to FIGS. 9, 10A, and 10B, the pixel structure 2 may include a guide structure 20, a plurality of ultra small light-emitting diodes 40, and a dam structure 70 disposed on the base substrate 5. The guide structure 20 may have a central region 210 and a plurality of guide regions 220 extending in radial form from the central region 210.

The central region 210 is a place where the solution 90 (e.g., refer to FIG. 13C) that includes a plurality of the ultra small light-emitting diodes 30 is dropped in a process of manufacturing the pixel structure 2. The central region 210 may have a width greater than the diameter of a drop of the solution 90. The central region 210 may have a polygonal shape, a circular shape, an oval shape, or another shape.

The guide regions 220 are connected to the central region 210 and extend in radial form from the central region 210. In the process of manufacturing the pixel structure 2, the solution 90 dropped in the central region 210 may be distributed to the guide regions 220 by capillary pressure. The guide regions 220 may have a width greater than the length of the ultra small light-emitting diode 30. The width of the guide regions 220 is less than a width of the central region 210. The solution 90 that includes the ultra small light-emitting diodes 30 may move along the guide regions 220 in the process of manufacturing the pixel structure 2.

The guide structure 20 may include a first electrode 11b and a second electrode 12b that are spaced apart from each other. The first and second electrodes 11b and 12b extend in radial form. The guide regions 220 may be defined by the first and second electrodes 11b and 12b. The first and second electrodes 11b and 12b may be alternately disposed from each other.

At least one of the first and second electrodes 11b and 12b may have a reflection surface that reflects light. The reflection surface faces the ultra small light-emitting diode 30. For example, each of the first and second electrodes 11b and 12b may have a reflection surface disposed to the ultra small light-emitting diode 30. For this purpose, the first and second electrodes 11b and 12b may include a material having a reflection characteristic or the reflection surface may be treated to have a reflection characteristic.

The reflection surface of the first and second electrodes 11b and 12b may reflect light emitted from the ultra small light-emitting diode 30 towards an upper side of the pixel structure 2. For this purpose, the thicknesses of the first and second electrodes 11b and 12b may be greater than the thickness of the ultra small light-emitting diode 30. An angle θ of the reflection surface with respect to the base substrate 5 may be less than 90 degrees.

Figure 11:
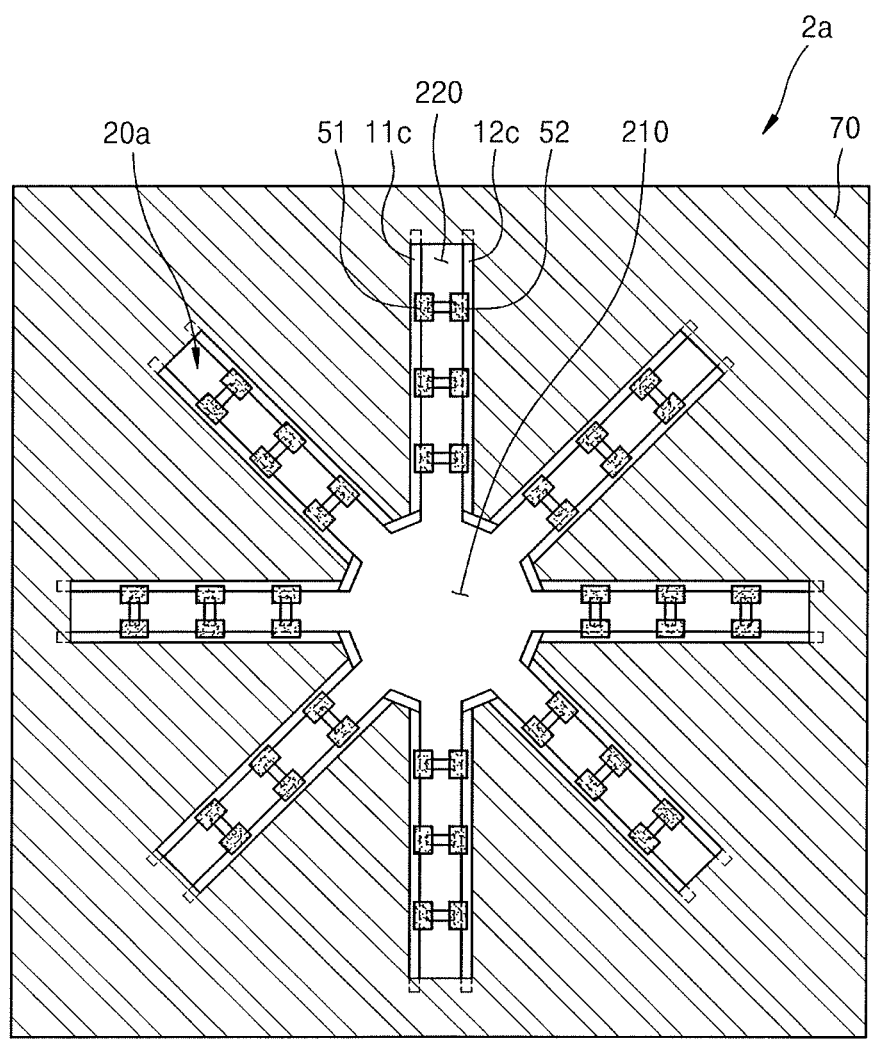
FIG. 11 illustrates another embodiment of a pixel structure.

The first and second electrodes 11b and 12b may have, for example, a polygonal shape, a triangular shape, or another shape. The first and second electrodes 11c and 12c may have a bar shape (e.g., see FIG. 11) or another shape.

The width of the guide regions 220 may be a separation distance between the first electrode 11b and the second electrode 12b. The separation distance L2 between the first and second electrodes 11b and 12b may be greater than the length L1 of the ultra small light-emitting diode 30. Accordingly, even when a high voltage is applied to the first and second electrodes 11b and 12b in a process of manufacturing the pixel structure 2, damage to the ultra small light-emitting diode 30 or to the first and second electrodes 11b and 12b may be prevented.

The first contact electrode 51 may connect the ultra small light-emitting diode 30 and the first electrode 11b. The second contact electrode 52 may connect the ultra small light-emitting diode 30 and the second electrode 12b.

The first and second contact electrodes 51 and 52 may include a conductive metal. As an example, the first and second contact electrodes 51 and 52 may include at least one metal of Al, Ti, In, Au, or Ag. As another example, the first and second contact electrodes 51 and 52 may include a transparent electrode. For example, the first and second contact electrodes 51 and 52 respectively may include at least one of ITO to IGO as the transparent electrode.

The dam structure 70 may be on outer side of the first and second electrodes 11b and 12b. The dam structure 70 may be configured to block an end of the guide region 220. Accordingly, the dam structure 70 may prevent a solution 90 including a plurality of the ultra small light-emitting diodes 30 from inadvertently moving out to other regions from the guide regions 220 in a process of manufacturing the pixel structure 2.

The thickness of the dam structure 70 may be greater than thicknesses of the first and second electrodes 11b and 12b. The dam structure 70 may prevent the solution 90 including a plurality of the ultra small light-emitting diodes 30 from inadvertently moving to other regions in a process of manufacturing the pixel structure 2.

The dam structure 70 may include a material that is able to maintain a predetermined thickness. For example, the dam structure 70 may include polyimide. A surface of the dam structure 70 may have hydrophobicity.

In the present embodiment, the guide regions 220 of the guide structure 20 are defined by the first and second electrodes 11b and 12b. In another embodiment, the guide regions 220 may be defined by other features.

Figure 12:
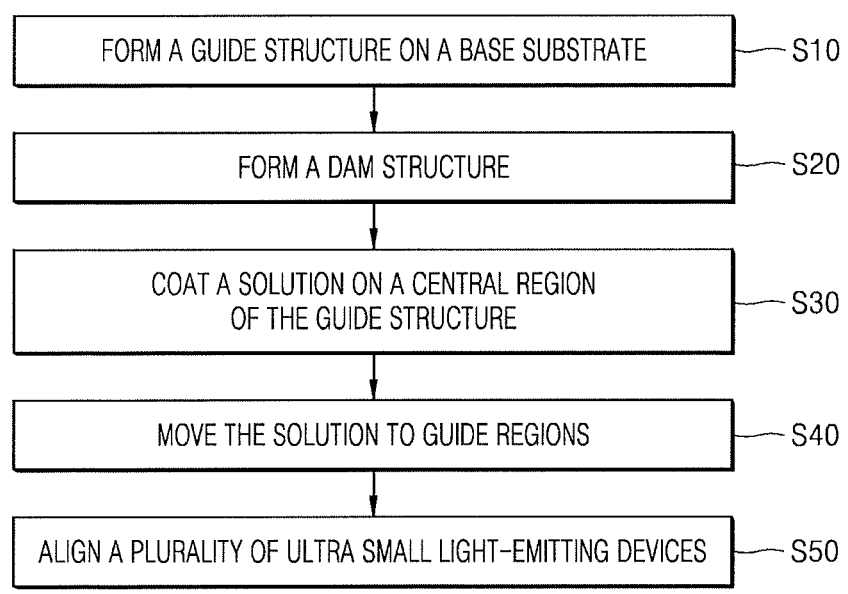
FIG. 12 illustrates another embodiment of a method for manufacturing a pixel structure according to an embodiment.
Figure 13A:
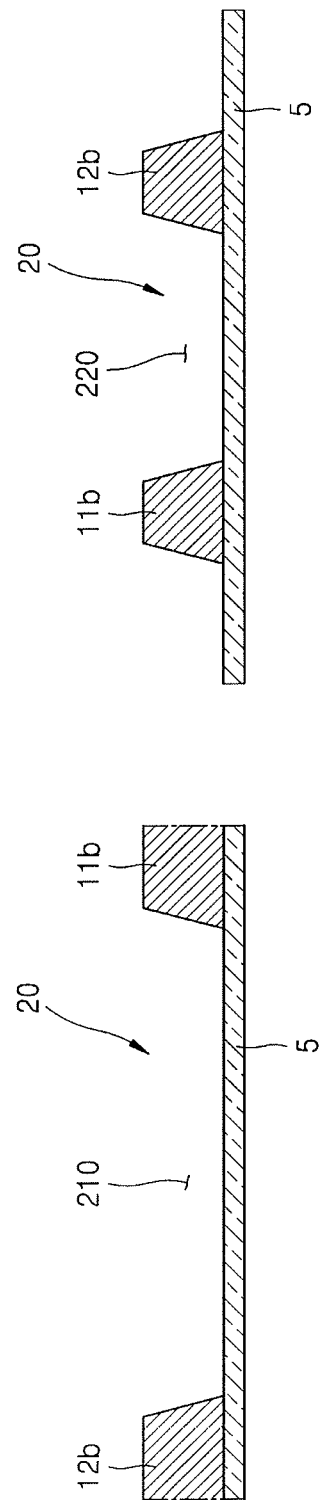
FIGS. 13A and 13F illustrate various stages in the method of FIG. 12.

FIG. 12 illustrates an embodiment of a method for manufacturing a pixel structure. FIGS. 13A and 13F are cross-sectional views of the pixel structure according to an embodiment. FIGS. 13A through 13F show the central region 210 and the guide regions 220 of the guide structure 20 in each operation.

Referring to FIGS. 12 and 13A, a guide structure 20 is formed on a base substrate 5 (S10). The guide structure 20 includes a central region 210 and a plurality of guide regions 220 extending in a radial shape from the central region 210. The width of the central region 210 is greater than the guide regions 220. The guide regions 220 may be defined by first and second electrodes 11b and 12b spaced apart from each other.

Figure 13B:
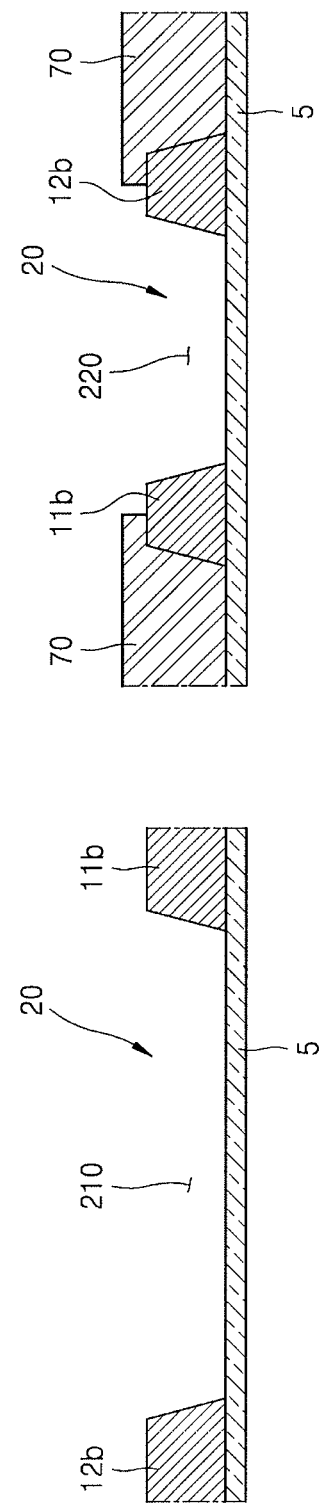

Referring to FIGS. 12 and 13B, a dam structure 70 that blocks an edge of the guide region 220 is formed (S20). The dam structure 70 may cover a part of the first and second electrodes 11b and 12b. The thickness of the dam structure 70 may be greater than thicknesses of the first and second electrodes 11b and 12b.

Figure 13C:
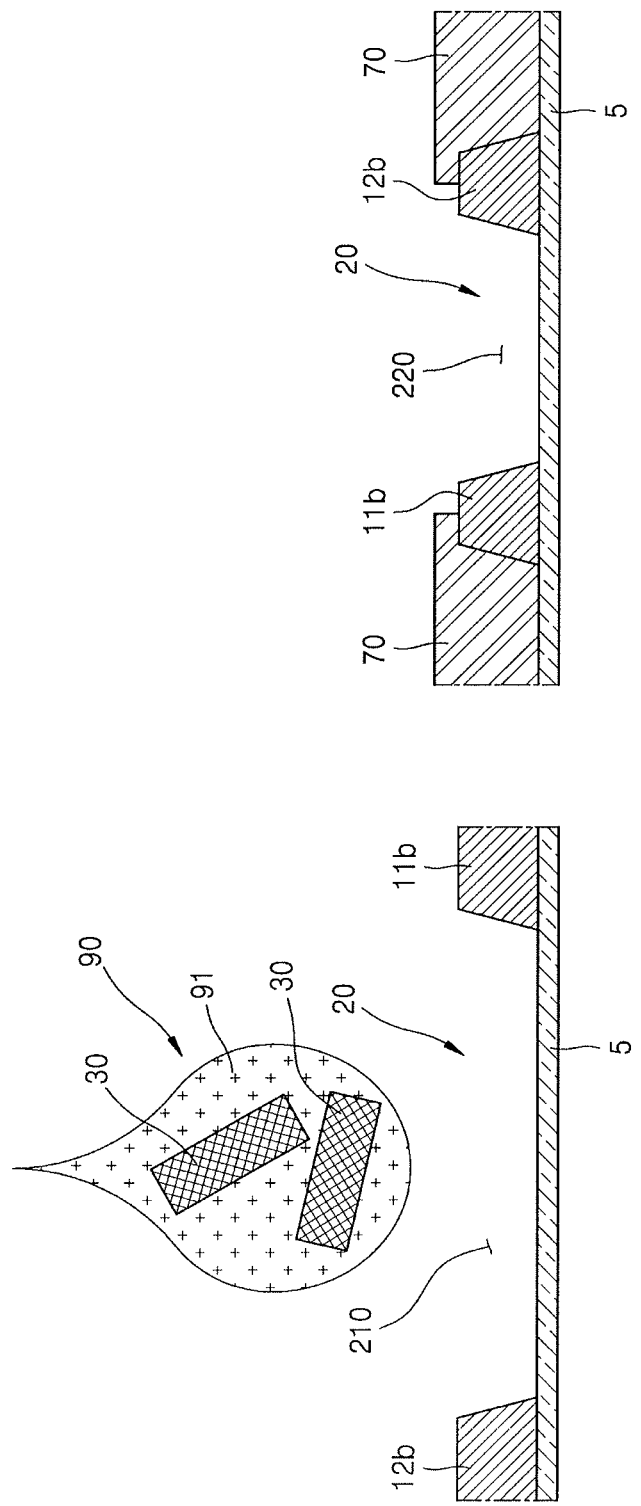

Referring to FIGS. 12 and 13C, the guide structure 20 may be coated with a solution 90 that includes a plurality of ultra small light-emitting diodes 30 (S30). The width of the central region 210 may be greater than the diameter of a drop of solution 90.

Figure 13D:
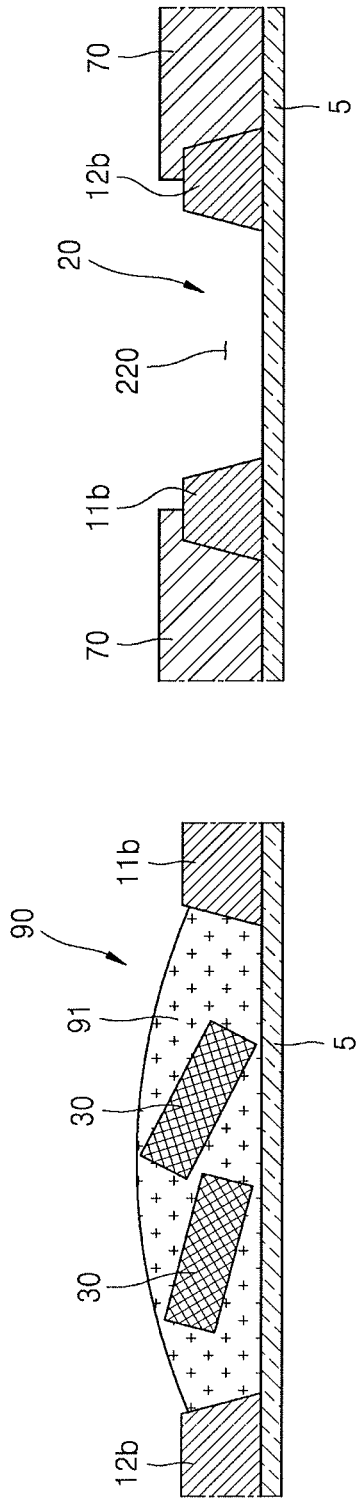
Figure 13E:
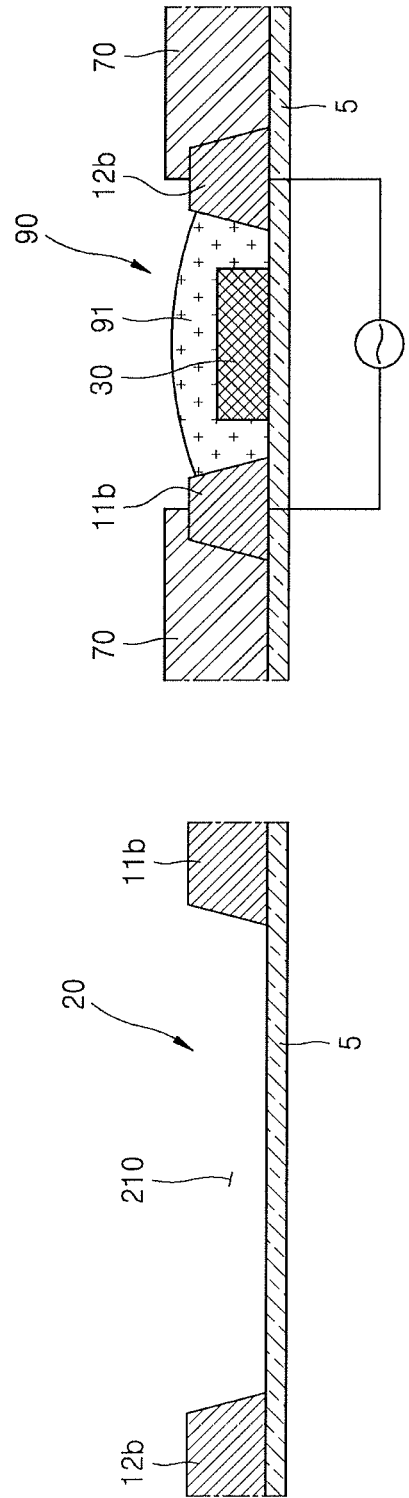
Figure 13F:
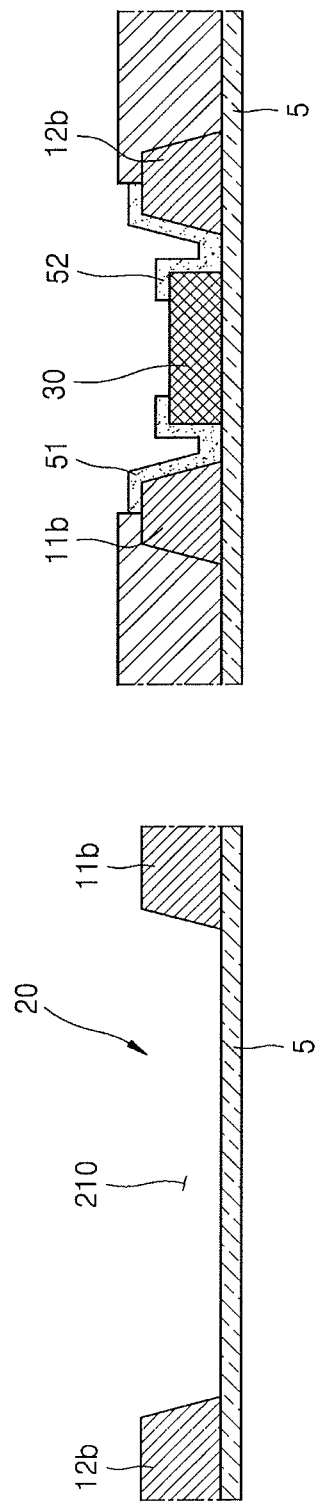

Referring to FIGS. 12, 13D, and 13E, the solution 90 coated in the central region 210 may be distributed to the guide regions 220 (S40). Thus, a plurality of the ultra small light-emitting diodes 30 may be moved to the guide regions 220. The ultra small light-emitting diodes 30 may be aligned by applying a high voltage to the first and second electrodes 11b and 12b (S50). The high voltage may be in a range from 20V to 50V. The ultra small light-emitting diodes 30 may be arranged so that both ends of each of the ultra small light-emitting diodes 30 face the first and second electrodes 11b and 12b.

Referring to FIGS. 12 and 13F, when the ends of each of the ultra small light-emitting diodes 30 face the first and second electrodes 11b and 12b between the first and second electrodes 11b and 12b, the solvent 91 of the solution is removed. The solvent 91 may be removed, for example, using an evaporation method.

After the solvent 91 is removed, first and second contact electrodes 51 and 52 are formed to contact the ultra small light-emitting diode 30 and the first and second electrodes 11b and 12b. The first and second contact electrodes 51 and 52 may be transparent electrodes. Accordingly, light emitted from the ends of the ultra small light-emitting diode 30 may be reflected at the first and second electrodes 11b and 12b.

Figure 14:
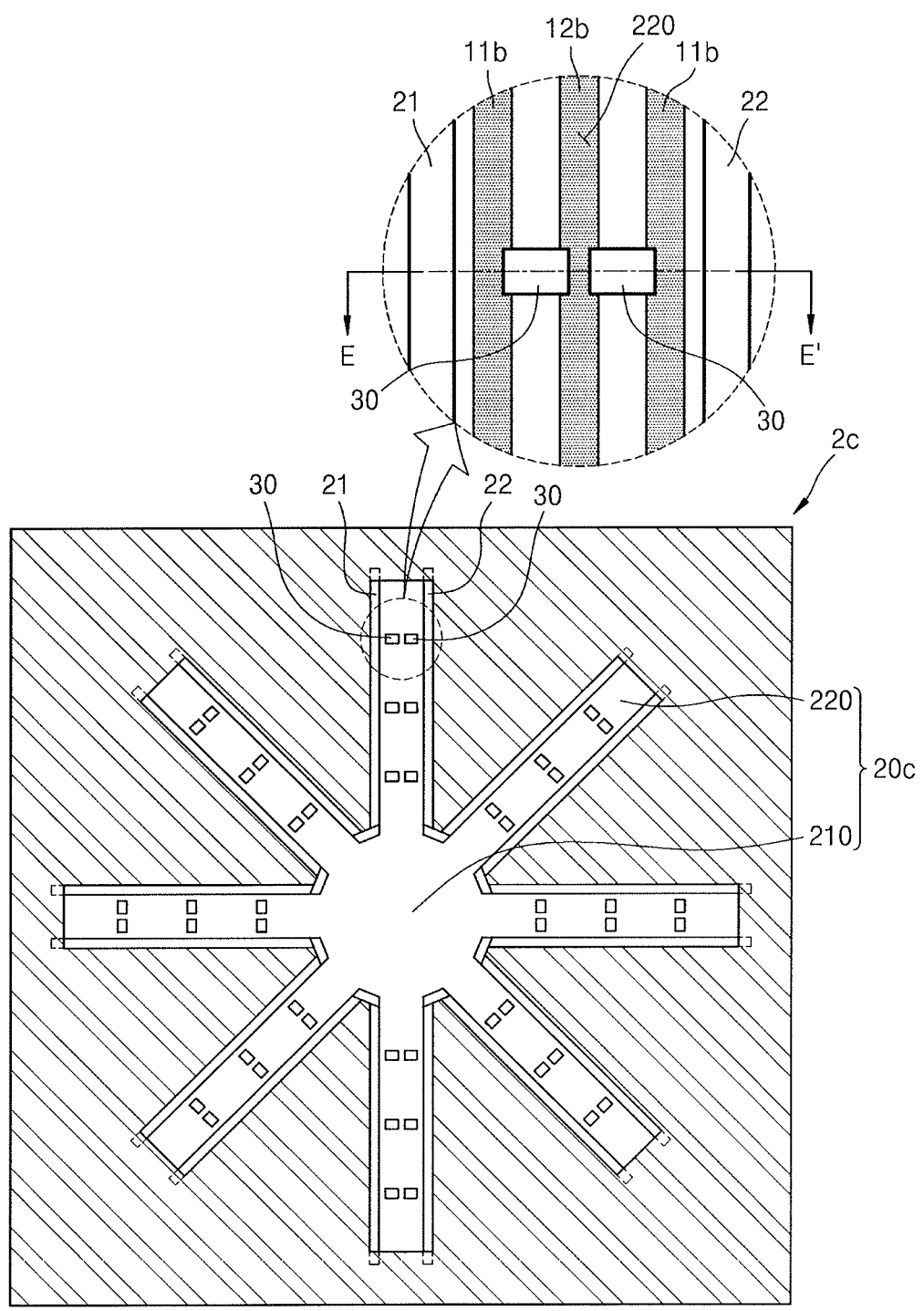
FIGS. 14 and 15 illustrate another embodiment of a pixel structure.
Figure 15:
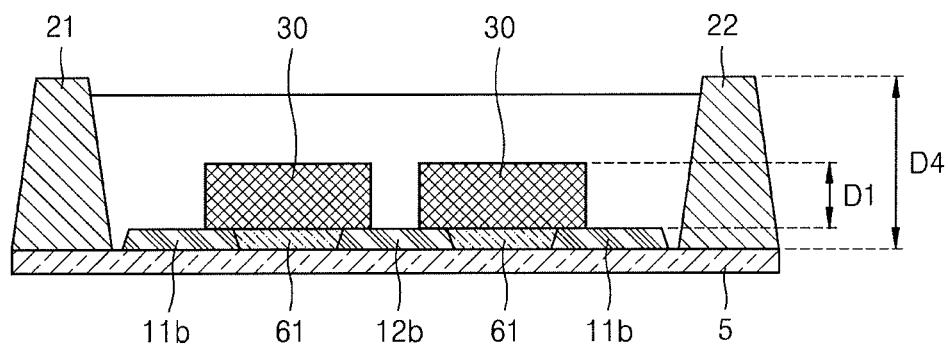

FIGS. 14 and 15 respectively illustrate plan and cross-sectional views of another embodiment of a pixel structure 2c having a guide structure 20c. FIG. 13A through 13F are cross-sectional views taken along line E-E' of the pixel structure 2c.

Referring to FIGS. 14 and 15, the guide structure 20c may include a plurality of guide bars 21 and 22 extending in a radial shape and separated from each other to define the guide regions 220. The guide bars 21 and 22 may include a different material from the first and second electrodes 11b and 12b. For example, the material of the guide bars 21 and 22 may be an organic material or an inorganic material that is able to maintain a predetermined shape. For example, the material of the guide bars 21 and 22 may include polyimide. Surfaces of the guide bars 21 and 22 may have hydrophobicity.

The thicknesses D4 of the guide bars 21 and 22 may be greater than the thickness D1 of the ultra small light-emitting diode 30. The guide bars 21 and 22 may have a thickness D4 greater than the thickness D1 of the first and second electrodes 11b and 12b. The guide bars 21 and 22 may be on an outer side of the first and second electrodes 11b and 12b in the guide regions 220.

The distance between the adjacent guide bars 21 and 22 is greater than the length of the ultra small light-emitting diode 30. Thus, in a process of manufacturing the pixel structure 2c, the solution 90 that includes a plurality of the ultra small light-emitting diodes 30 may move along the guide regions 220.

The distance between the first and second electrodes 11b and 12b may be less than the length of the ultra small light-emitting diode 30. A filler 61 may be between the first and second electrodes 11b and 12b to prevent the ultra small light-emitting diode 30 from becoming stuck between the first and second electrodes 11b and 12b. The filler 61 may include a different material from the first and second electrodes 11b and 12b. For example, the filler 61 may not include a metal and may include an organic material or an inorganic material.

The ultra small light-emitting diode 30 may be on the first and second electrodes 11b and 12b in contact with the first and second electrodes 11b and 12b. The ultra small light-emitting diode 30 and first and second electrodes 11b and 12b may be electrically connected to each other via first and second contact electrodes.

Figure 16:
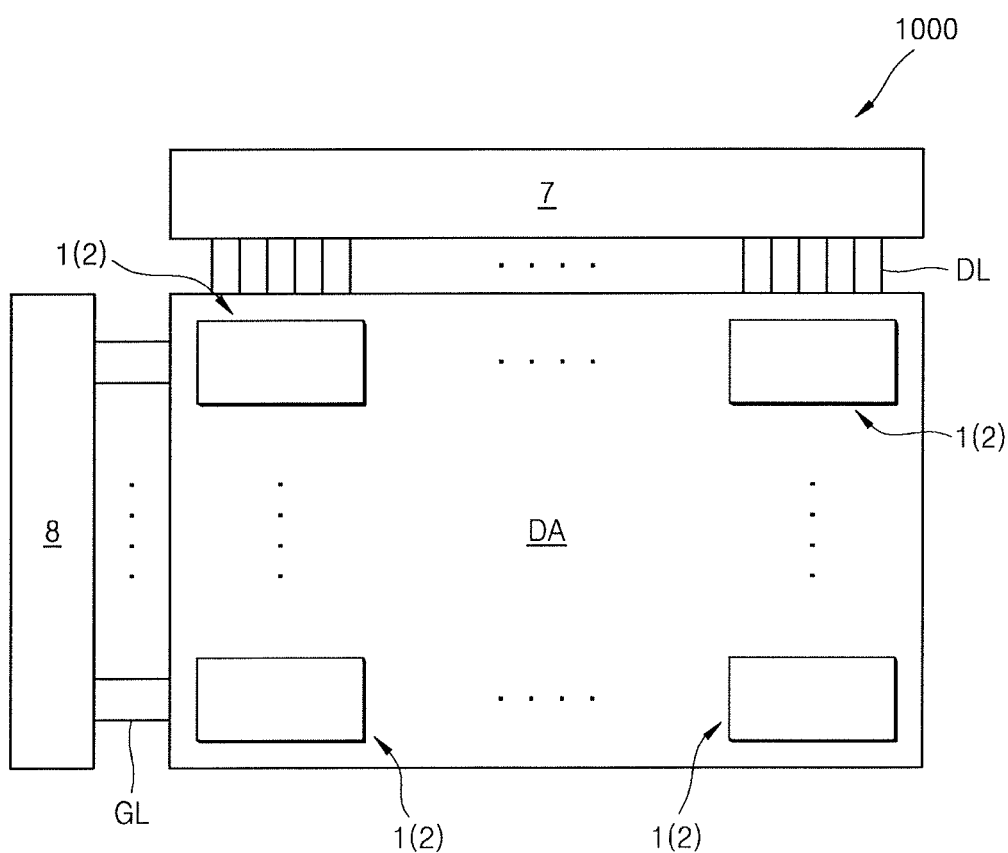
FIG. 16 illustrates an embodiment of a pixel structure.

FIG. 16 illustrates an embodiment of a display apparatus 1000 which includes the pixel structures 1 and 2 and a plurality of driving circuits connected to the pixel structures 1 and 2. The pixel structures 1 and 2 may be in a display area DA of the display apparatus 1000. The driving circuits may be in a non-display area outside the display area DA. The driving circuit includes a data driving circuit 7 and a gate driving circuit 8.

The length of a side of the pixel structures 1 and 2 may be less than, for example, 600 μm. When the pixel structures 1 and 2 form sub-pixels, the length of a side of the pixel structures 1 and 2 may be less than, for example, 200 μm. A side of the pixel structures 1 and 2 may be a short side of the pixel structure 2. The size of the pixel structures 1 and 2 and the number of pixels may be different in another embodiment.

The data driving circuit 7 includes one or more source drive ICs to drive data lines DL. The gate driving circuit 8 includes at least one gate driver to supply a scan pulse to gate lines GL.

The display apparatus 1000 may be a passive-matrix type display apparatus or an active-matrix type display apparatus according to the driving method of the ultra small light-emitting diodes 30. As an example, if the display apparatus 1000 is an active-matrix type display apparatus, the pixel structures 1 and 2, like the embodiments described above, may include a driving transistor and a switching transistor. The driving transistor controls the amount of current supplied to the ultra small light-emitting diode 30. The switching transistor transmits a voltage to the first transistor. The active-matrix type display apparatus has a predetermined the resolution, contrast, and operation speed and controls light emission by selecting unit pixels. The passive-matrix type display apparatus may also be provided which controls light emission by pixel groups.

Figure 17:
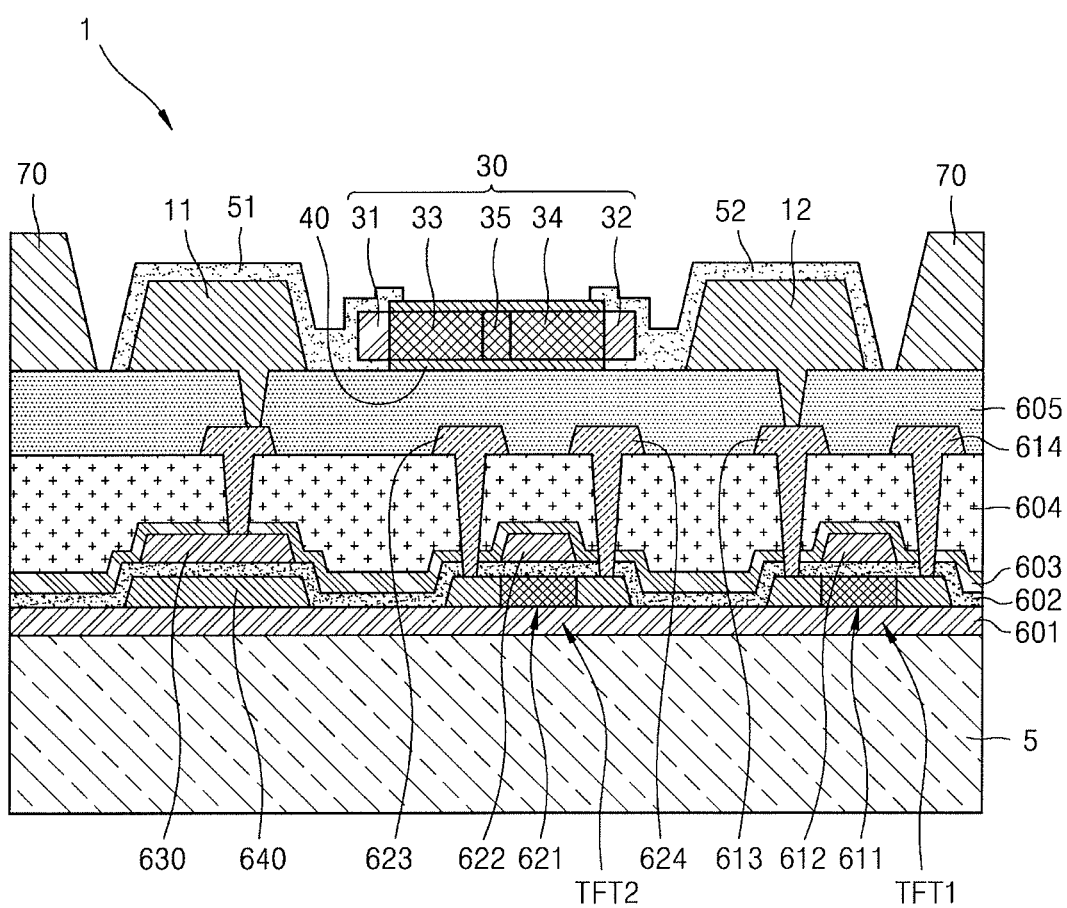
FIGS. 17 and 18 illustrate another embodiment of a pixel structure.

FIGS. 17 and 18 are cross-sectional views of a pixel structure 1 of FIG. 16, according to an embodiment. FIGS. 17 and 18 explain embodiments of pixel structures of an active-matrix type display apparatus.

Referring to FIGS. 1 and 17, the pixel structure 1 includes an electrode line 10, an ultra small light-emitting diode 30, and a connection electrode 50 disposed on the base substrate 5. Also, the pixel structure 1 includes the dam structure 70 on outer side of the electrode line 10. The electrode line 10 includes a first electrode 11 and a second electrode 12 separate from and is flush with the first electrode 11 on the base substrate 5. The ultra small light-emitting diode 30 is between the first and second electrodes 11 and 12. The ultra small light-emitting diode 30 may have a length L1 less than a distance L2 between the first and second electrodes 11 and 12.

Referring to FIGS. 9 and 18, the pixel structure 2 includes a guide structure 20, a ultra small light-emitting diode 30, and a dam structure 70 on the base substrate 5. The guide structure 20 may include a central region 210 and a plurality of guide regions 220 extending in a radial shape from the central region 210. The guide structure 20 may include first and second electrodes 11b and 12b spaced apart from each other.

Referring to FIGS. 17 and 18, a buffer layer 601 may further be formed on the base substrate 5. The buffer layer 601 may prevent impurity ions from diffusing on an upper surface of the base substrate 5, may prevent the penetration of moisture or external air into the pixel structure 2, and may perform a planarizing function of a surface of the base substrate 5.

In an embodiment, the buffer layer 601 may include an inorganic material, such as silicon oxide, silicon nitride, silicon oxynitride, aluminum oxide, aluminum nitride, titanium oxide, or titanium nitride or an organic material, such as polyimide, polyester, or acryl, or a stack of these materials. The buffer layer 601 may be omitted in some embodiments. The buffer layer 601 may be formed by various deposition methods, for example, a plasma enhanced chemical vapor deposition (PECVD) method, an atmospheric pressure CVD (APCVD) method, or a low pressure CVD (LPCVD) method.

A first thin film transistor (TFT1) includes a first active layer 611, a first gate electrode 612, a first drain electrode 613, and a first source electrode 614. A first gate insulating film 602 may be between the first gate electrode 612 and the first active layer 611 to insulate therebetween. The first gate electrode 612 may overlap part of the first active layer 611 on the first gate insulating film 602. The first thin film transistor TFT1 is below the ultra small light-emitting diode 30 and may be a driving TFT for driving the ultra small light-emitting diode 30.

The second thin film transistor TFT2 includes a second active layer 621, a second gate electrode 622, a second drain electrode 623, and a second source electrode 624. The first gate insulating film 602 may be between the second gate electrode 622 and the second active layer 621 to insulate therebetween. The second gate electrode 622 may overlap part of the second active layer 621 on the first gate insulating film 602.

The first active layer 611 and the second active layer 621 may be arranged on the buffer layer 601. The first active layer 611 and the second active layer 621 may include an inorganic semiconductor such as amorphous silicon or poly silicon or an organic semiconductor. In an embodiment, the first active layer 611 may include an oxide semiconductor. For example, the oxide semiconductor may include an oxide of a material selected from a metal element of 12, 13, and 14 groups, such as Zn, In, Ga, Sn, Cd, Ge, or Hf and a combination of these metal elements.

The first gate insulating film 602 is formed on the buffer layer 601 to cover the first active layer 611 and the second active layer 621. A second gate insulating film 603 covers the first gate electrode 612 and the second gate electrode 622.

The first gate electrode 612 and the second gate electrode 622 may include a single layer film or a multilayer film of Au, Ag, Cu, Ni, Pt, Pd, Al, Mo, or Cr, or an alloy, such as Al:Nd or Mo:W.

The first gate insulating film 602 and the second gate insulating film 603 may include an inorganic material film, such as a silicon oxide, a silicon nitride, or a metal oxide, and may be formed as a single-layer or a multi-layer.

An interlayer insulating layer 604 may be formed on the second gate insulating film 603. The interlayer insulating layer 604 may include an inorganic material film, such as a silicon oxide or a silicon nitride. The interlayer insulating layer 604 may include an organic material film.

The first drain electrode 613 and the first source electrode 614 are on the interlayer insulating layer 604. The first drain electrode 613 and the first source electrode 614 are respectively connected to the first active layer 611 via contact holes. Also, the second drain electrode 623 and the second source electrode 624 are formed on the interlayer insulating layer 604 and are respectively connected to the second active layer 621 via contact holes. The first drain electrode 613, the second drain electrode 623, the first source electrode 614, and the second source electrode 624 may include a metal, an alloy, a metal nitride, a conductive metal oxide, or a transparent conductive material.

The first and second TFTs TFT1 and TFT2 may be different in structure and/or conductivity in other embodiments. For example, the first and second TFTs TFT1 and TFT2 have a top-gate structure, or may have a bottom-gate structure in which the first gate electrode 612 is below the first active layer 611.

A planarizing film 605 covering the first and second TFTs TFT1 and TFT2 is on the interlayer insulating layer 604. The planarizing film 605 may perform functions of removing a step difference and planarizing a surface of a resultant product, in order to increase light emission efficiency of the ultra small light-emitting diode 30 to be formed thereon. Also, the planarizing film 605 may include a through hole that exposes part of the first drain electrode 613.

The planarizing film 605 may include an insulating material. For example, the planarizing film 605 may be formed as a single-layer structure or a multi-layer structure of an inorganic material, an organic material, or a composite of organic/inorganic materials, formed by various deposition methods. According to an embodiment, the planarizing film 605 may include at least one of a polyacrylate group resin, an epoxy resin, a phenolic resin, a polyamide group resin, a polyimide group rein, an unsaturated polyester group resin, a poly phenylenether group resin, a poly phenylenesulfide group resin), or benzocyclobutene (BCB). In one embodiment, one of the interlayer insulating layer 604 or the planarizing film 605 may be omitted.

The first electrodes 11 and 11b may be on the planarizing film 605 and may be electrically connected to the ultra small light-emitting diode 30. The first electrodes 11 and 11b and the first drain electrode 613 may be connected to each other via the through hole in the planarizing film 605.

The second electrodes 12 and 12b may be on the planarizing film 605 and electrically connected to the ultra small light-emitting diode 30. The second electrodes 12 and 12b may be electrically connected to a power line 630. As an example, a planarizing film 640 for planarizing a lower surface of the power line 630 may be below the power line 630. In one embodiment, the planarizing film 640 may be omitted.

The pixel structures including an ultra small light-emitting diode, the display apparatuses including the pixel structures, and methods of manufacturing the display apparatus described above may prevent damage to the ultra small light-emitting diode in a process of aligning the ultra small light-emitting diode and may increase emission efficiency of light emitted on a front side of the display apparatus. The pixel structures including an ultra small light-emitting diode, display apparatuses including the pixel structures, and methods of manufacturing the pixels structures described above may prevent the ultra small light-emitting diode from deviating to a region in a process of aligning the ultra small light-emitting diode.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, various changes in form and details may be made without departing from the spirit and scope of the embodiments set forth in the claims.

What is claimed is:

1. A pixel structure of a display apparatus, the pixel structure comprising:
    an electrode line including a second electrode separated from a first electrode and at a same level as the first electrode on a base substrate;
    at least one light-emitting diode on the base substrate, having a length in a length direction that is less than a distance between an end of the first electrode and an end of the second electrode facing the first electrode in the length direction, and having a first electrode layer at a first edge of the at least one light-emitting diode and a second electrode layer at a second edge of the at least one light-emitting diode; and
    a connection electrode contacting the electrode line and the light-emitting diode, and including a first contact electrode connecting the first electrode to the light-emitting diode and a second contact electrode connecting the second electrode and the light-emitting diode,
    wherein the first electrode layer and the second electrode layer have oppositely facing surfaces with respect to the length direction,
    wherein the surface of the first electrode layer is arranged to face the end of the first electrode in the length direction, and
    wherein the surface of the second electrode layer is arranged to face the end of the second electrode in the length direction.

2. The pixel structure of a display apparatus as claimed in claim 1, wherein the first and second contact electrodes are transparent electrodes.

3. The pixel structure of a display apparatus as claimed in claim 1, wherein a surface of at least one of the first or second electrodes facing the light-emitting diode is a reflection surface that reflects light to be emitted from the light-emitting diode.

4. The pixel structure of a display apparatus as claimed in claim 3, wherein each of the first and second electrodes has a thickness greater than a thickness of the light-emitting diode.

5. The pixel structure of a display apparatus as claimed in claim 3, wherein an angle of the reflection surface relative to the base substrate is less than 90 degrees.

6. The pixel structure of a display apparatus as claimed in claim 1, wherein the light-emitting diode further includes:
   first and second semiconductor layers between the first and second electrode layers; and
   a first active layer between the first and second semiconductor layers,
   wherein at least one of first and second electrode layers is a transparent electrode.

7. The pixel structure of a display apparatus as claimed in claim 1, wherein each of the first and second electrodes includes a main electrode extending in a first direction and a finger electrode extending from the main electrode in a second direction crossing the first direction.

8. The pixel structure of a display apparatus as claimed in claim 7, wherein a surface of the finger electrode facing the light-emitting diode is a reflection surface to reflect light.

9. The pixel structure of a display apparatus as claimed in claim 8, wherein the finger electrode is electrically connected to the light-emitting diode via at least one of the first or second contact electrodes.

10. The pixel structure of a display apparatus as claimed in claim 1, further comprising a dam structure on an outer side of the first and second electrodes, wherein the dam structure has a thickness greater than thicknesses of each of the first and second electrodes.

11. The pixel structure of a display apparatus as claimed in claim 1, further comprising:
    a driving transistor electrically connected to the first electrode; and
    a power line electrically connected to the second electrode.

12. A display apparatus, comprising:
    the pixel structure as claimed in claim 1; and
    a driving circuit connected to the pixel structure.

13. The pixel structure of a display apparatus as claimed in claim 1, wherein the first and second contact electrodes include indium (In).

* * * * *